(12) United States Patent
Sekiya

(10) Patent No.: US 11,059,673 B2
(45) Date of Patent: Jul. 13, 2021

(54) CONVEYANCE SYSTEM

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/932,021

(22) Filed: Jul. 17, 2020

(65) Prior Publication Data

US 2021/0024294 A1    Jan. 28, 2021

(30) Foreign Application Priority Data

Jul. 26, 2019 (JP) .............................. JP2019-137609

(51) Int. Cl.
*B65G 35/06* (2006.01)
*B65G 1/04* (2006.01)
*B65G 43/10* (2006.01)
*B65G 41/00* (2006.01)

(52) U.S. Cl.
CPC ............ *B65G 35/06* (2013.01); *B65G 1/0457* (2013.01); *B65G 41/006* (2013.01); *B65G 43/10* (2013.01); *B65G 2201/0297* (2013.01)

(58) Field of Classification Search
CPC ...... B65G 35/06; B65G 1/0457; B65G 43/10; B65G 2201/0297

USPC ........................................ 700/214, 228, 247
See application file for complete search history.

(56) References Cited

U.S. PATENT DOCUMENTS 10,964,571 B2\* 3/2021 Sekiya ................ H01L 21/6719
2018/0358252 A1\* 12/2018 Honda .............. H01L 21/67733

FOREIGN PATENT DOCUMENTS

JP          06177244 A      6/1994

\* cited by examiner

*Primary Examiner* — Gene O Crawford
*Assistant Examiner* — Lester Rushin, III
(74) *Attorney, Agent, or Firm* — Greer Burns & Crain Ltd.

(57) ABSTRACT

A conveyance system for conveying a workpiece to each of a plurality of processing apparatuses includes a track extending over the plurality of processing apparatuses and fixed to the upper portions of the processing apparatuses; an automated conveying vehicle for traveling on the track, the automated conveying vehicle including a storage member having a housing space for housing the workpiece therein, a traveling member coupled from above to the storage member, a traveling mechanism mounted on the traveling member, a lifting and lowering mechanism mounted on the traveling member, for lifting and lowering the storage member while suspending the storage member from above, and a receiver for receiving control signals.

4 Claims, 17 Drawing Sheets

CONVEYANCE SYSTEM

BACKGROUND OF THE INVENTION

Field of the Invention

The present invention relates to a conveyance system that conveys a workpiece to a processing apparatus.

Description of the Related Art

In a manufacturing step of device chips incorporated into electronic equipment and so forth, a plate-shaped workpiece typified by a semiconductor wafer or resin package substrate is processed by various kinds of processing apparatuses. When the workpiece is conveyed to this processing apparatus, normally a cassette for conveyance that can house plural workpieces is used.

Incidentally, in the above-described method in which plural workpieces are housed in the cassette and are conveyed to a processing apparatus at a time, unprocessed workpieces housed in the cassette are made to wait without exception when the processing apparatus stops due to any cause. That is, processing of the unprocessed workpieces by another processing apparatus also becomes impossible and thus the efficiency of the processing greatly lowers.

To solve this problem, for example, it is preferable to convey workpieces to a processing apparatus one by one according to the operation status of the processing apparatus. Thus, a conveyance system has been proposed in which plural processing apparatuses are coupled by a path for conveyance and a workpiece can be conveyed to each processing apparatus at an arbitrary timing (for example, refer to Japanese Patent Laid-open No. Hei 6-177244).

SUMMARY OF THE INVENTION

However, a conduit connecting part to which conduits are connected, a door for maintenance, and so forth are disposed on a side surface of each processing apparatus, and the path for conveyance needs to be designed in such a manner as not to interfere with them when the above-described conveyance system is constructed. For this reason, constructing the conveyance system is not necessarily easy and the path for conveyance also tends to become long.

Thus, an object of the present invention is to provide a conveyance system that can convey a workpiece to each of plural processing apparatuses and is also easy to construct.

In accordance with an aspect of the present invention, there is provided a conveyance system for conveying a workpiece to each of a plurality of processing apparatuses. The conveyance system includes a track fixed to an upper portion of the processing apparatus over the plurality of processing apparatuses, an automated conveying vehicle for traveling on the track, the automated conveying vehicle including a workpiece storage member having a housing space for housing the workpiece therein, a traveling member coupled to the workpiece storage member from above, a traveling mechanism mounted on the traveling member, a lifting and lowering mechanism disposed in the traveling member for lifting and lowering the workpiece storage member while suspending the workpiece storage member from above, and a receiver for receiving control signals, a stock unit including a workpiece storage member holding base for holding the workpiece storage member thereon when the workpiece is transferred from a workpiece stocker housing the workpiece therein to the workpiece storage member of the automated conveying vehicle, and a receiver for receiving control signals, and a control unit including a transmitter for transmitting control signals to the processing apparatuses, the automated conveying vehicle, and the stock unit, a receiver for receiving notification signals transmitted from the processing apparatuses, and a control signal generating section for generating control signals to be transmitted from the transmitter, in which the control signal generating section of the control unit generates control signals to be transmitted from the transmitter of the control unit on the basis of notification signals received by the receiver of the control unit, the transmitter of the control unit transmits the control signals generated by the control signal generating section of the control unit to the processing apparatuses, the automated conveying vehicle, and the stock unit, and the automated conveying vehicle travels on the track on the basis of control signals received by the receiver.

In the above-described conveyance system, the track includes a plurality of rails connected together; and the automated conveying vehicle travels on the rails with the storage member disposed below the rails.

Furthermore, in the above-described conveyance system, the track includes legs having suction members that adhere under suction to the processing apparatus, and is fixed to the processing apparatus by the suction members.

The conveyance system according to the aspect of the present invention includes the track extending over the plurality of processing apparatuses and fixed to upper portions of the processing apparatus, the automated conveying vehicle for traveling on the track with the storage member disposed below the track, the automated conveying vehicle including the lifting and lowering mechanism for lifting and lowering the storage member while suspending the storage member from above, the storage member having the housing space for housing a workpiece therein, and the stock unit including the storage member holding base for holding the storage member thereon when the workpiece is transferred from the workpiece stocker housing workpieces therein to the storage member.

After a workpiece has been conveyed from the workpiece stocker to the storage member held on the workpiece storage member holding base, the automated workpiece conveying vehicle travels on the track for thereby conveying the workpiece to each of the processing apparatus. In the conveyance system according to the aspect of the present invention, the track is fixed to the upper portions of the processing apparatus. Therefore, when the conveyance system including the track is to be designed, it is not necessary to take into account the structure of side surfaces of each processing apparatus. In other words, it is easy to construct the conveyance system.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Embodiments of the present invention will be described with reference to the accompanying drawings. In the following respective embodiments, conveyance systems that convey workpieces and so forth to plural cutting apparatuses will be described. However, it suffices for the conveyance system of the present invention to be configured to be capable of conveying workpieces and so forth to plural processing apparatuses. That is, the conveyance destination of the workpiece and so forth may be a processing apparatus other than a cutting apparatus.

For example, the conveyance system of the present invention is configured to be capable of conveying workpieces to plural laser processing apparatuses in some cases. Furthermore, for example, the conveyance system of the present invention is configured to be capable of conveying a workpiece sequentially to plural kinds of processing apparatuses used for a series of processing in other cases. In the present description, all apparatuses that can be used in a series of steps for processing a workpiece will be referred to as processing apparatuses. Specifically, the processing apparatuses in the present invention include a tape sticking apparatus, an ultraviolet radiation applying apparatus, a cleaning apparatus, and so on that may not necessarily be aimed at processing a workpiece.

First Embodiment

Figure 1:
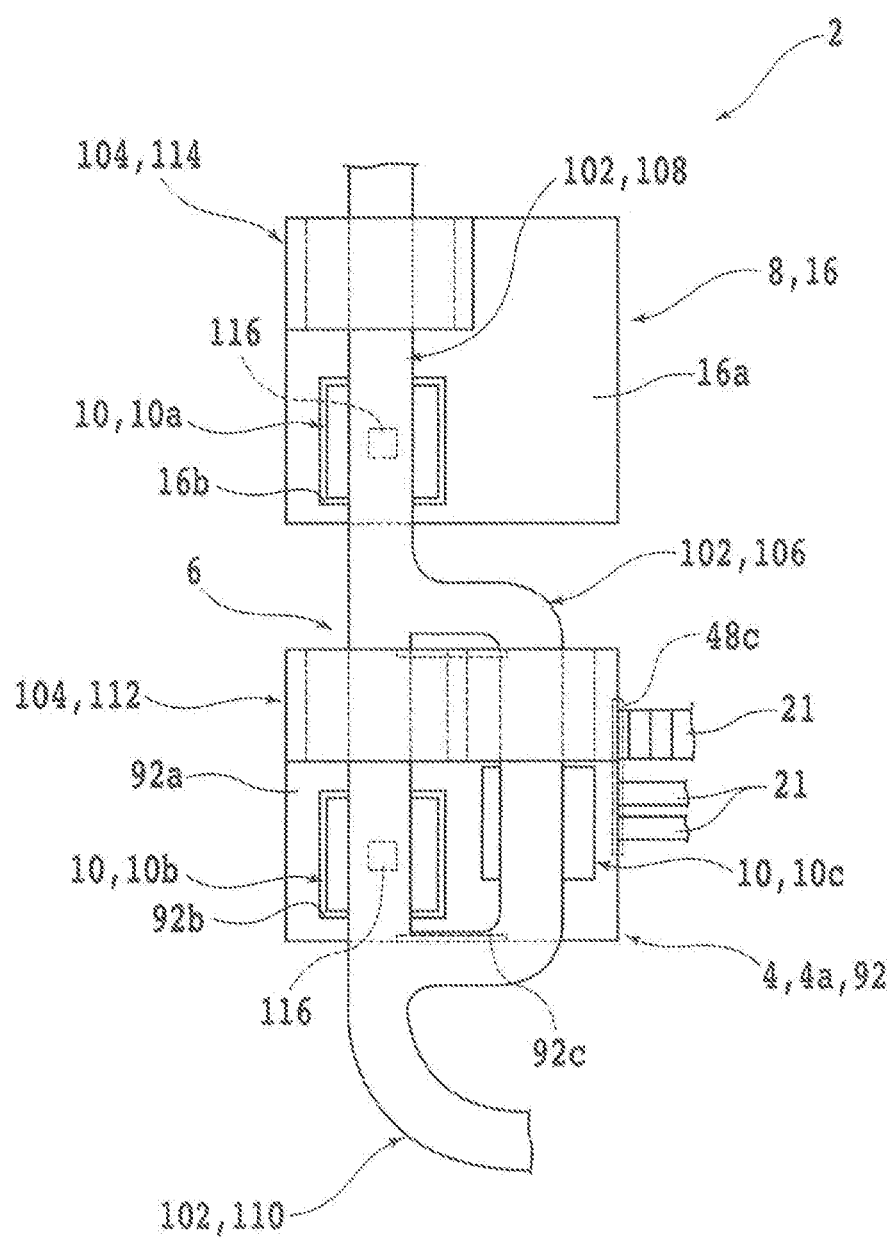
FIG. 1 is a plan view illustrating a configuration example of a conveyance system according to a first embodiment.
Figure 2:
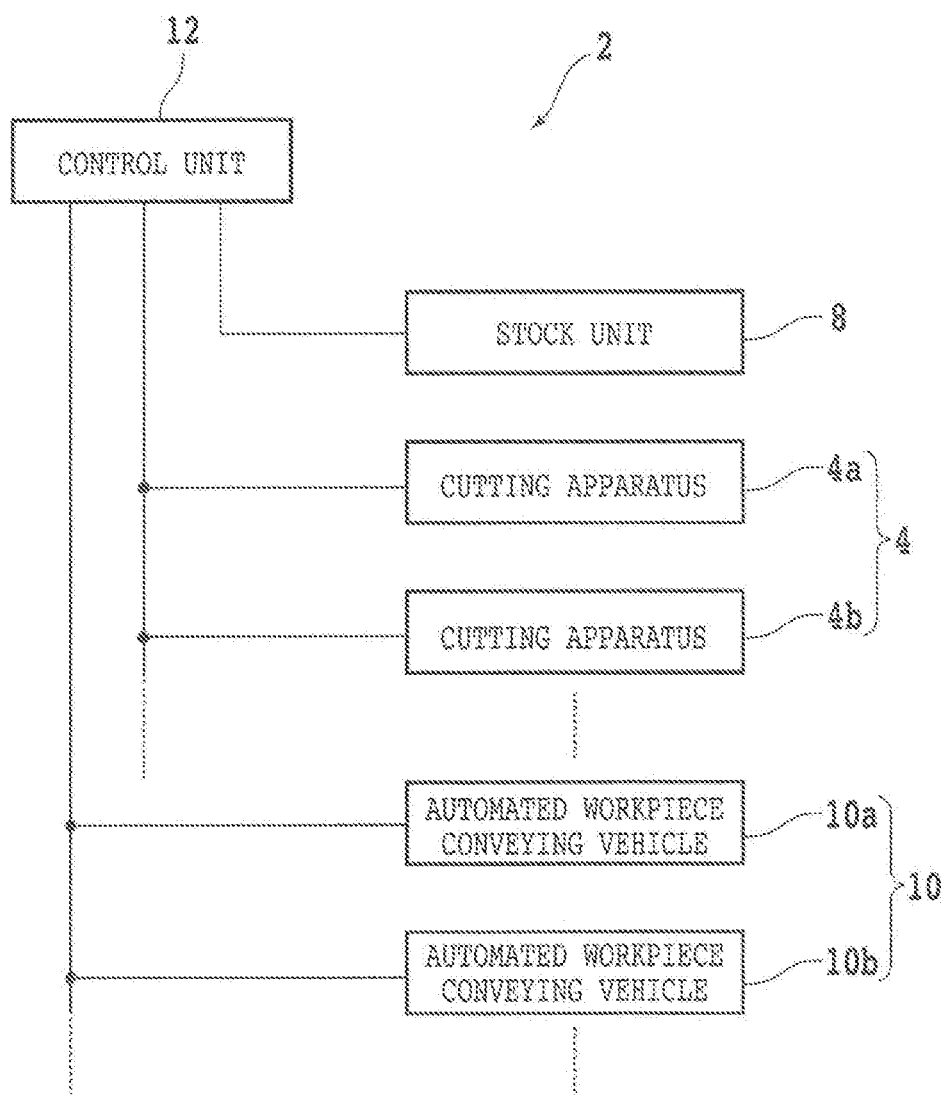
FIG. 2 is a functional block diagram illustrating an example of the connection relationship of the conveyance system according to the first embodiment.

FIG. 1 is a plan view illustrating a configuration example of a conveyance system 2 according to the present embodiment and FIG. 2 is a functional block diagram illustrating an example of the connection relationship of the conveyance system 2. As illustrated in FIG. 1, the conveyance system 2 according to the present embodiment includes a track 6 used for conveying a plate-shaped workpiece 11 (see FIG. 4B and so forth) processed by a cutting apparatus (processing apparatus) 4.

The workpiece 11 is a wafer that is composed of a semiconductor material such as silicon and has a circular disc shape, for example. The front surface side of this workpiece 11 is segmented into plural small regions by plural planned dividing lines (streets) intersecting each other and a device such as an integrated circuit (IC) or a micro electro mechanical system (MEMS) is formed in each small region.

A tape (dicing tape) 13 with a diameter larger than the workpiece 11 is stuck to the back surface side of the workpiece 11. The peripheral part of the tape 13 is fixed to a ring-shaped frame 15 that surrounds the workpiece 11. The workpiece 11 is conveyed to the cutting apparatus 4 in the state of being supported by the frame 15 with the intermediary of this tape 13.

Although the wafer that is composed of a semiconductor material such as silicon and has a circular disc shape is employed as the workpiece 11 in the present embodiment, there is no limit to the material, shape, structure, size, and so forth of the workpiece 11. For example, it is also possible to use a substrate or the like composed of a material such as another semiconductor, ceramic, resin, or metal as the workpiece 11.

Similarly, there is no limit also to the kind, quantity, shape, structure, size, arrangement, and so forth of the devices. The devices do not have to be formed on the workpiece 11. According to the present embodiment, the workpiece 11 supported on the frame 15 by the tape 13 is treated as a target to be conveyed. However, the workpiece 11 to which the tape 13 is not stuck, the workpiece 11 not supported on the frame 15, or the like may also be treated as a target to be conveyed.

Furthermore, the cutting apparatus 4 that processes this workpiece 11 is connected to the conveyance system 2 as the conveyance destination of the workpiece 11. However, the cutting apparatus 4 is not necessarily a constituent element of the conveyance system 2. Thus, the cutting apparatus 4 may be changed or omitted according to the form of use of the conveyance system 2 as described above.

Then, for convenience of description, only one cutting apparatus 4a is illustrated in FIG. 1 and two cutting apparatuses 4a and 4b are illustrated in FIG. 2. However, in the present embodiment, two or more cutting apparatuses 4 are necessary as the conveyance destination of the workpiece 11. That is, the number of processing apparatuses connected to the conveyance system 2 is two or more.

The track 6 is disposed across plural cutting apparatuses 4 so that the workpiece 11 can be conveyed to each cutting apparatus 4. That is, the plural cutting apparatuses 4 are coupled to each other through the track 6. Furthermore, the track 6 is fixed to an upper portion of the cutting apparatus 4. For this reason, the track 6 does not interfere with conduits 21 and so forth connected to a side surface of each cutting apparatus 4.

Below the track 6, a stock unit 8 that can house plural workpieces 11 is disposed besides the cutting apparatus 4. The workpiece 11 housed in the stock unit 8 is carried in to an automated workpiece conveying vehicle (automated conveying vehicle) 10 at an arbitrary timing. The automated workpiece conveying vehicle 10 travels on the track 6 and conveys the workpiece 11 to each cutting apparatus 4. Although three automated workpiece conveying vehicles 10a, 10b, and 10c are illustrated in FIG. 1 and two automated workpiece conveying vehicles 10a and 10b are illustrated in FIG. 2, there is no limit to the number of automated workpiece conveying vehicles 10.

As illustrated in FIG. 2, to the cutting apparatuses 4, the stock unit 8, and the automated workpiece conveying vehicles 10, a control unit 12 that controls operation of them is wirelessly connected. However, it suffices for the control unit 12 to be configured to be capable of controlling operation of the cutting apparatuses 4, the stock unit 8, and the automated workpiece conveying vehicles 10 and the control unit 12 may be connected to them in a wired manner in some cases.

Figure 3:
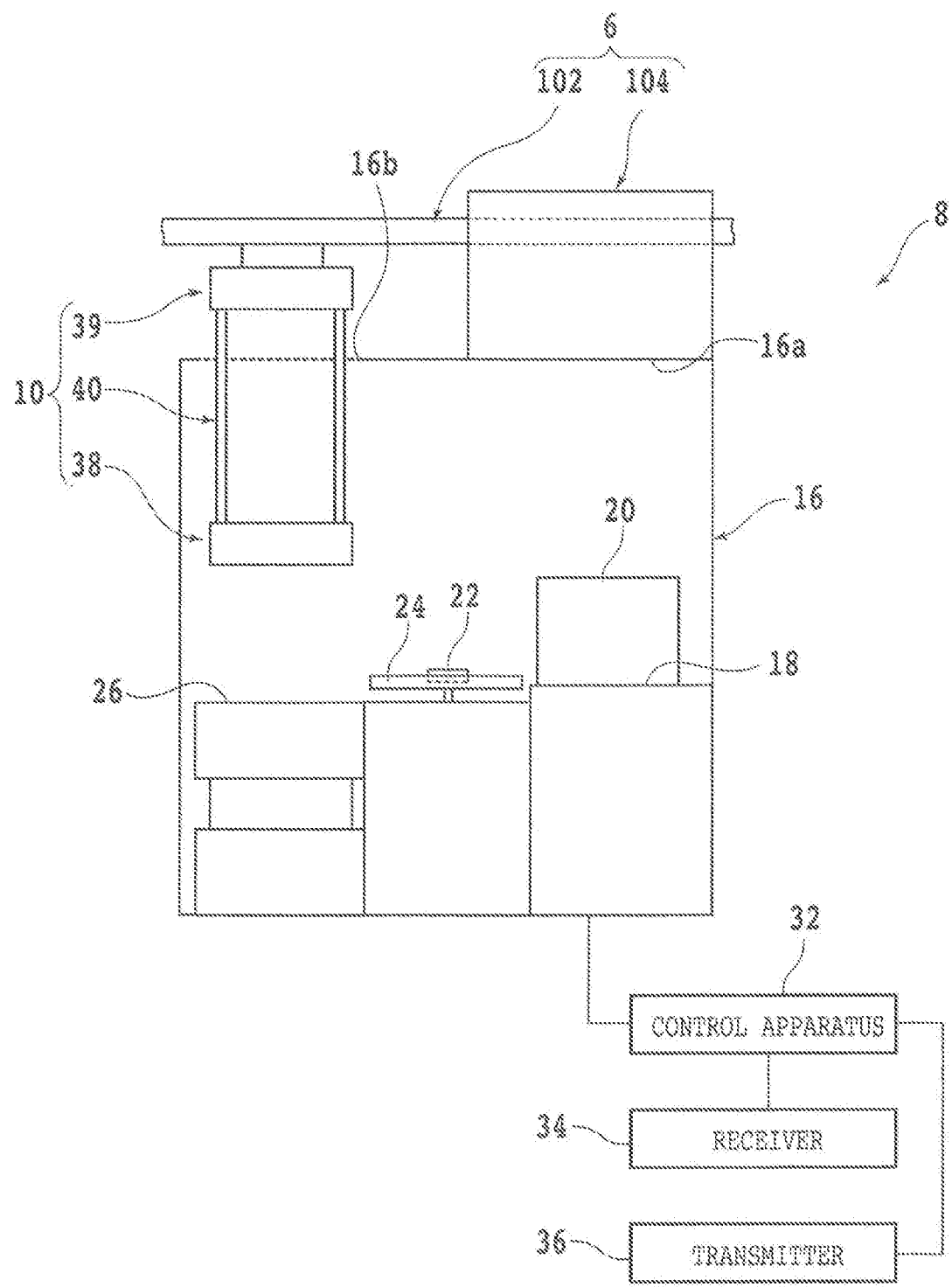
FIG. 3 is a side view schematically illustrating a configuration example of a stock unit according to the first embodiment.

FIG. 3 is a side view schematically illustrating a configuration example of the stock unit 8. As illustrated in FIG. 3, the stock unit 8 includes a casing 16 that houses various constituent elements. In this FIG. 3, only the contour of the casing 16 is illustrated for convenience of description.

In the casing 16, a cassette holding base 18 that moves up and down by a first raising-lowering mechanism (not illustrated) of a ball screw type is disposed, for example. A cassette (workpiece stocker) 20 that can house plural workpieces 11 is placed on the upper surface of the cassette holding base 18. This cassette 20 houses the workpieces 11 in the state of being supported by the frame 15 with the intermediary of the tape 13 as described above.

A push-pull arm 22 that can move while grasping the frame 15 is disposed on a lateral side of the cassette holding base 18. For example, when the height of the frame 15 housed in the cassette 20 is adjusted to the height of the push-pull arm 22 by the first raising-lowering mechanism and the frame 15 in the cassette 20 is grasped by this push-pull arm 22, the frame 15 can be drawn out to the outside of the cassette 20.

A pair of guide rails 24 made to get closer to and further away from each other while the state in which the guide rails 24 are parallel to each other is kept are disposed at positions that sandwich the push-pull arm 22. Each guide rail 24 includes a support surface that supports the frame 15 from the lower side and a side surface substantially perpendicular to the support surface. The guide rails 24 sandwich the frame 15 drawn out of the cassette 20 by the push-pull arm 22 and adjust the frame 15 to a predetermined position.

In a position on the opposite side to the cassette holding base 18 with respect to the push-pull arm 22 and the pair of guide rails 24, a workpiece storage member holding base 26 that moves up and down by a second raising-lowering mechanism (not illustrated) of a ball screw type is disposed, for example. A workpiece storage member 38 of the automated workpiece conveying vehicle 10 that can house the workpiece 11 (frame 15) is placed on the upper surface of this workpiece storage member holding base 26.

The frame 15 that has been aligned with a predetermined position by the pair of guide rails 24 is gripped again by the push-pull arm 22, and inserted laterally into the workpiece storage member 38 on the workpiece storage member holding base 26 whose height has been adjusted by the second lifting and lowering mechanism. In other words, the workpiece 11 is transferred to the workpiece storage member 38 held on the workpiece storage member holding base 26.

A position regulating member (not illustrated) for regulating the position of the workpiece storage member 38 is disposed on an upper surface of the workpiece storage member holding base 26. When a workpiece 11 is transferred from the cassette 20 that houses workpieces 11 therein to the workpiece storage member 38 of the automated workpiece conveying vehicle 10, therefore, the workpiece storage member 38 is positioned in a predetermined position determined by the position regulating member on the workpiece storage member holding base 26.

The casing 16 has an opening 16b defined in a ceiling 16a thereof and extending vertically therethrough in a region directly above the workpiece storage member holding base 26. The opening 16b is of such a shape and size that allow at least the workpiece storage member 38 of the automated workpiece conveying vehicle 10 placed on the workpiece storage member holding base 26 to pass therethrough. The workpiece storage member 38 is conveyed from outside of the casing 16 into the casing 16 through the opening 16b or from inside of the casing 16 out of the casing 16 through the opening 16b.

A control apparatus 32 for controlling operation of the stock unit 8 is connected to constituent elements such as the first raising-lowering mechanism, the push-pull arm 22, the pair of guide rails 24, and the second raising-lowering mechanism. Typically, the control apparatus 32 is formed of a computer including a processing apparatus such as a central processing unit (CPU) and a storing apparatus such as a flash memory, and functions of the control apparatus 32 are implemented by causing the processing apparatus and so forth to operate in accordance with software stored in the storing apparatus.

A receiver 34 that receives a signal for control (control signal) transmitted from the control unit 12 of the conveyance system 2 and a transmitter 36 that transmits a signal for notification (notification signal) to the control unit 12 are further connected to the control apparatus 32. The control apparatus 32 controls the operation of the stock unit 8 based on the signal received by the receiver 34. Furthermore, the control apparatus 32 transmits the necessary signal to the control unit 12 through the transmitter 36.

Figure 4A:
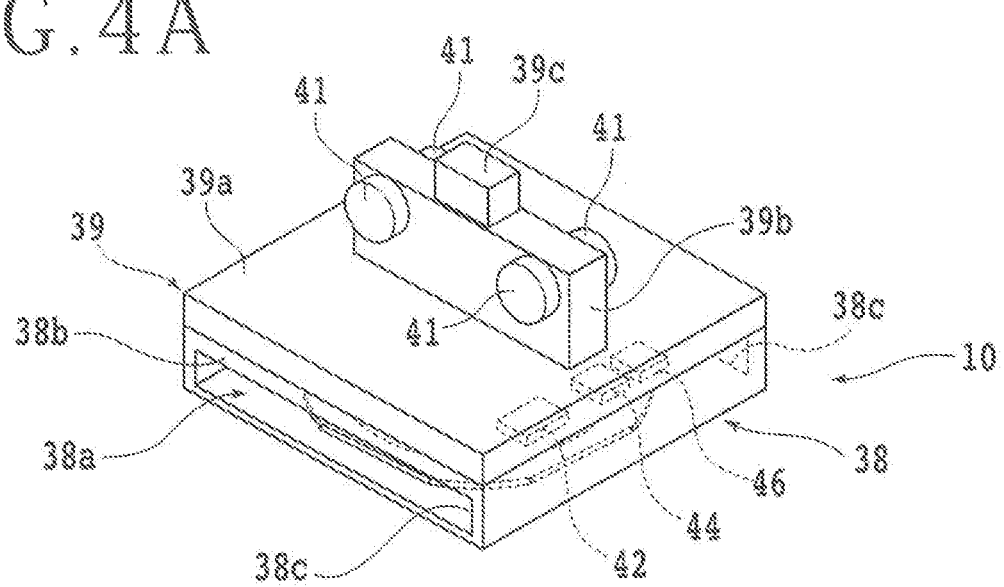
FIG. 4A is a perspective view schematically illustrating a configurational example of an automated workpiece conveying vehicle according to the first embodiment.
Figure 4B:
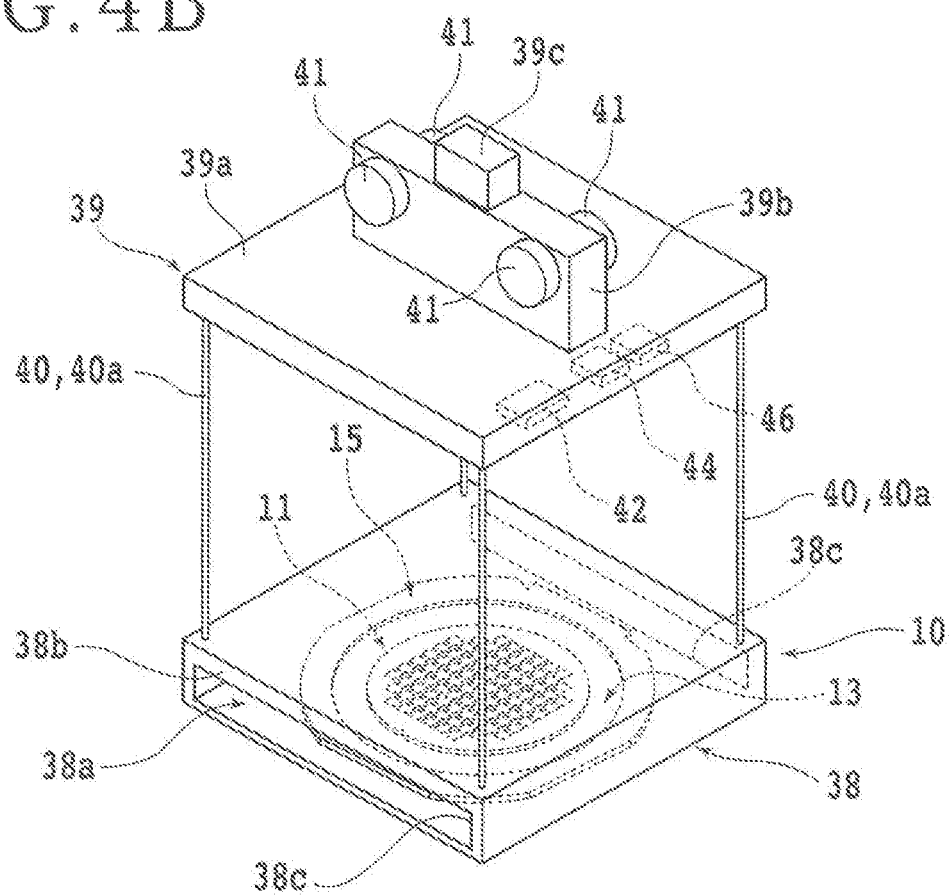
FIG. 4B is a perspective view illustrating the manner in which a workpiece storage member of the automated workpiece conveying vehicle is lifted and lowered.

FIG. 4A is a perspective view schematically illustrating a configurational example of the automated workpiece conveying vehicle 10, and FIG. 4B is a perspective view illustrating the manner in which the workpiece storage member 38 of the automated workpiece conveying vehicle 10 is lifted and lowered. As illustrated in FIGS. 4A and 4B, for example, the automated workpiece conveying vehicle 10 includes a workpiece storage member 38, shaped as a rectangular parallelepiped, for housing a single workpiece 11 (and a frame 15) therein.

The workpiece storage member 38 has a space, i.e., a housing space, 38a defined therein for housing a workpiece 11 (and a frame 15). The workpiece storage member 38 has a pair of side surfaces 38b each having an opening 38c that is of a size large enough to allow a workpiece 11 (and a frame 15) to pass therethrough. The space 38a in the workpiece storage member 38 is connected to the outside through the openings 38c. Therefore, a workpiece 11 (and a frame 15) is (are) loaded into and out of the space 38a in the workpiece storage member 38 through the openings 38c.

The automated workpiece conveying vehicle 10 also includes a traveling member 39 disposed over the workpiece storage member 38. The traveling member 39 includes a base 39a shaped as a flat plate and having a size which is approximately the same as the workpiece storage member 38 as viewed in plan. Lifting and lowering mechanisms 40 (FIG. 4B) are disposed on the lower surfaces of regions corresponding to the respective four corners of the base 39a. Each of the lifting and lowering mechanisms 40 includes a wire 40a having a tip end connected to the upper surface of the workpiece storage member 38 and a winch (not illustrated) fixed to the lower surface of the base 39a, for winding the wire 40a, and is able to lift and lower the workpiece storage member 38 while suspending the workpiece storage member 38.

Specifically, the traveling member 39 is coupled from above to the workpiece storage member 38 by the lifting and lowering mechanisms 40. When the winches are operated to unwind the wires 40a, for example, the workpiece storage member 38 is lowered from the traveling member 39, as illustrated in FIG. 4B. On the other hand, when the winches are operated to wind the wires 40a, the workpiece storage member 38 is lifted toward the traveling member 39.

A protrusive block 39b shaped as a rectangular parallelepiped is disposed on an upper surface of the base 39a. A plurality of, i.e., four in the present embodiment wheels, i.e., traveling mechanisms 41 are mounted on side surfaces of the protrusive block 39b. Each of the wheels 41 is coupled to a rotary actuator such as an electric motor or the like, and can be rotated thereby. A terminal 39c is disposed on an upper surface of the protrusive block 39b. Various components of the automated workpiece conveying vehicle 10 are supplied with electric power from an external source through the terminal 39c.

The base 39a also houses therein a control apparatus 42 for controlling operation of the automated workpiece conveying vehicle 10. Typically, the control apparatus 42 is formed of a computer including a processing apparatus such as a CPU and a storing apparatus such as a flash memory, and functions of the control apparatus 42 are implemented by causing the processing apparatus and so forth to operate in accordance with software stored in the storing apparatus.

To this control apparatus 42, a receiver 44 that receives a signal for control (control signal) transmitted from the control unit 12 of the conveyance system 2 and a transmitter 46 that transmits a signal for notification (notification signal) to the control unit 12 are connected. The control apparatus 42 controls operation of the automated workpiece conveying vehicle 10 on the basis of signals received by the receiver 44. Furthermore, the control apparatus 42 transmits the necessary signal to the control unit 12 through the transmitter 46.

The components of the automated workpiece conveying vehicle 10 may be electrically connected to a secondary battery, for example. In such a case, the components of automated workpiece conveying vehicle 10 can be operated by electric power supplied from the secondary battery. The secondary battery is supplied (charged) with electric power in a contact fashion using the terminal 39c, for example. However, the secondary battery may be charged in a non-contact fashion, i.e., a wireless or contact-free manner, not using the terminal 39c, etc.

Figure 5:
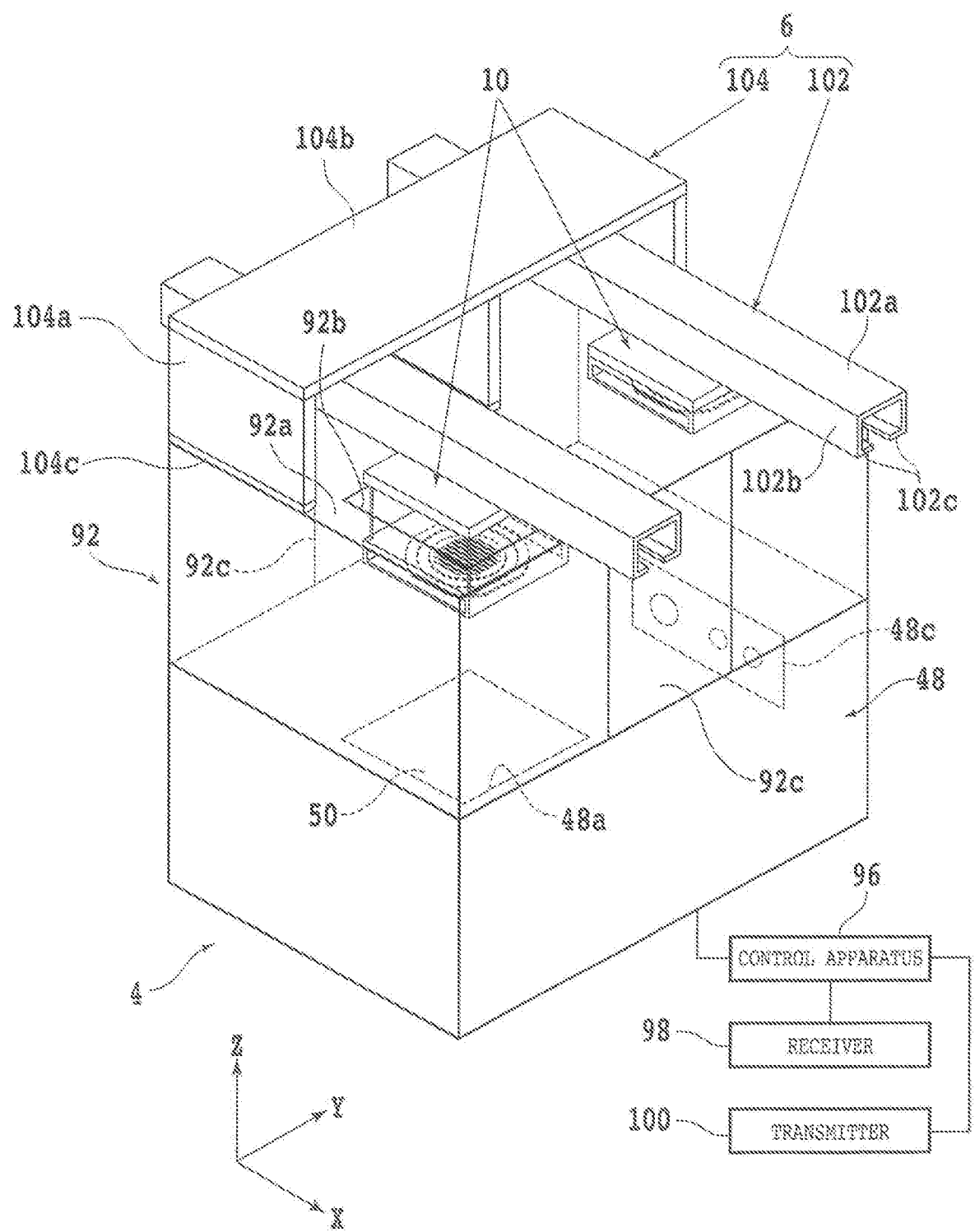
FIG. 5 is a perspective view illustrating the appearance of a cutting apparatus, a track, and so forth according to the first embodiment.
Figure 6:
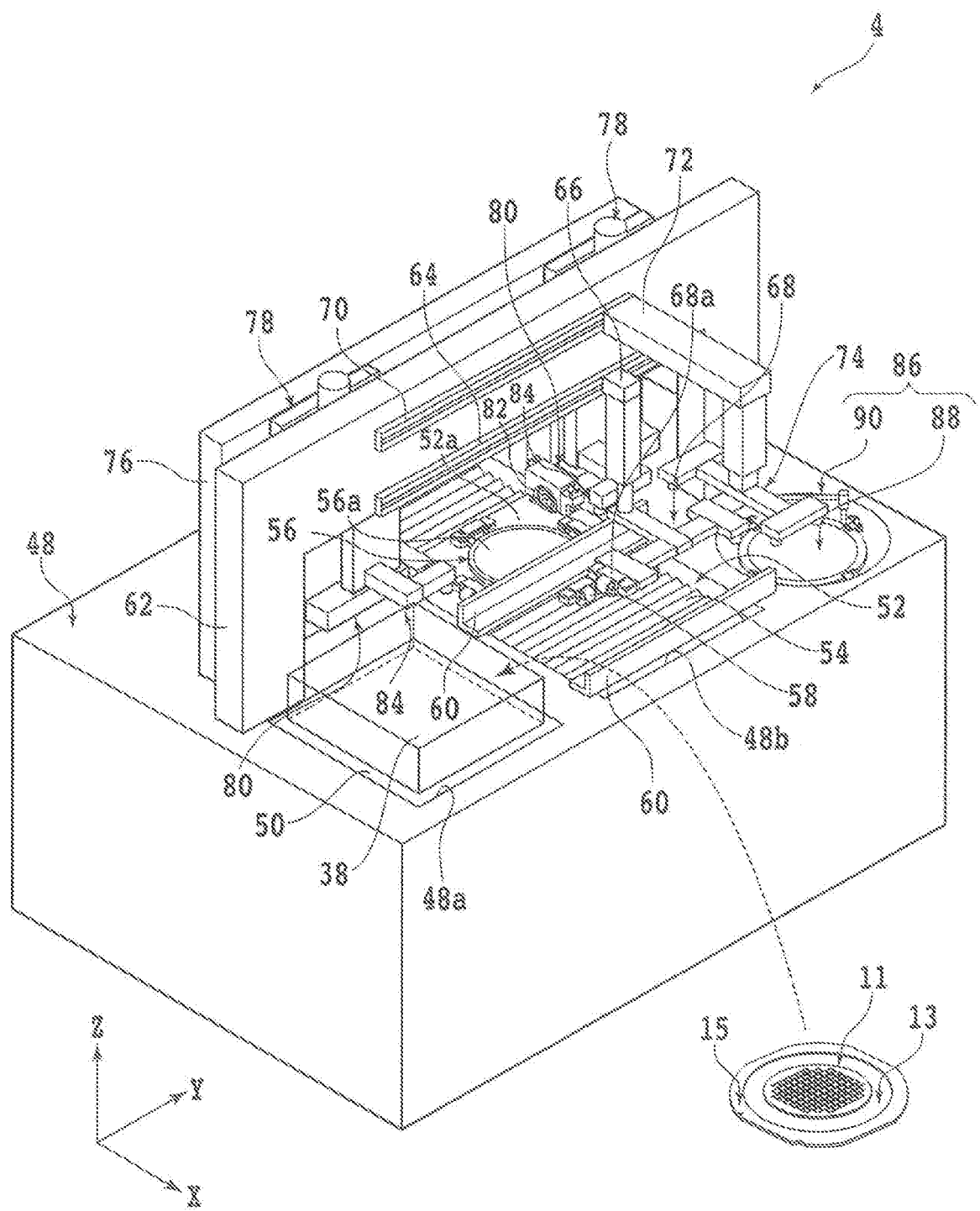
FIG. 6 is a perspective view illustrating a configuration example of the cutting apparatus.

FIG. 5 is a perspective view illustrating the appearance of the cutting apparatus 4, the track 6, and so forth and FIG. 6 is a perspective view illustrating a configuration example of the cutting apparatus 4. As illustrated in FIG. 5 and FIG. 6, the cutting apparatus 4 includes a pedestal 48 that supports the respective constituent elements. The pedestal 48 has an opening 48a defined in a corner thereof, and a storage member holding base 50 that can be raised and lowered by a lifting and lowering mechanism (not illustrated).

The workpiece storage member 38 of the automated workpiece conveying vehicle 10 is placed on an upper surface of the workpiece storage member holding base 50. The upper surface of the workpiece storage member holding base 50 has the position regulating member (not illustrated) for regulating a position of the workpiece storage member 38. The workpiece storage member 38 on the workpiece storage member holding base 50 is positioned in a predetermined position determined by the position regulating member.

As illustrated in FIG. 6, an opening 48b that is long in an X-axis direction (front-rear direction, processing feed direction) is formed on a lateral side of the opening 48a. An X-axis movement mechanism (processing feed unit) 52 of a ball screw type and a dust-proof and drip-proof cover 54 that covers the upper part of the X-axis movement mechanism 52 are disposed in the opening 48b. The X-axis movement mechanism 52 includes an X-axis movement table 52a and moves this X-axis movement table 52a in the X-axis direction.

A chuck table (holding table) 56 that sucks and holds the workpiece 11 is disposed on the X-axis movement table 52a. The chuck table 56 is coupled to a rotational drive source (not illustrated) such as a motor and rotates around a rotation axis substantially parallel to a Z-axis direction (vertical direction, cutting-in feed direction). Furthermore, the chuck table 56 moves in the X-axis direction (processing feed) by the above-described X-axis movement mechanism 52.

The upper surface of the chuck table 56 functions as a holding surface 56a for holding the workpiece 11. The holding surface 56a is connected to a suction source (not illustrated) through a suction path (not illustrated) formed inside the chuck table 56 and so forth. Furthermore, four clamps 58 for fixing the frame 15 that supports the workpiece 11 from four sides are disposed around the chuck table 56.

Above the opening 48b, a pair of guide rails (temporary putting region) 60 made to get closer to and further away from each other while the state in which the guide rails 60 are parallel to a Y-axis direction (right-left direction, indexing feed direction) is kept are disposed. The pair of guide rails 60 each include a support surface that supports the frame 15 from the lower side and a side surface substantially perpendicular to the support surface. The guide rails 60 sandwich the frame 15 drawn out of the workpiece storage member 38 in the X-axis direction and adjust the frame 15 to a predetermined position.

A first support structure 62 with a gate shape is disposed to straddle the opening 48b over the pedestal 48. A first rail 64 along the Y-axis direction is fixed to the front surface of the first support structure 62 (surface on the side of the guide rails 60) and a first holding unit 68 is coupled to this first rail 64 with the intermediary of a first movement mechanism 66 and so forth.

For example, the first holding unit 68 gets contact with the upper surface of the frame 15 to suck and hold this frame 15 and moves up and down by the first movement mechanism 66. In addition, the first holding unit 68 moves in the Y-axis direction along the first rail 64. A grasping mechanism 68a for grasping the frame 15 is disposed on the first holding unit 68 on the side of the opening 48a.

For example, when the frame 15 is grasped by the grasping mechanism 68a and the first holding unit 68 is moved in the Y-axis direction, the frame 15 in the workpiece storage member 38 can be drawn out to the pair of guide rails 60 or the frame 15 on the pair of guide rails 60 can be inserted into the workpiece storage member 38. After the position of the frame 15 is adjusted by the pair of guide rails 60, this frame 15 (workpiece 11) is sucked and held by the first holding unit 68 and is carried in to the chuck table 56.

Furthermore, on the front surface of the first support structure 62, a second rail 70 along the Y-axis direction is fixed to the upper side of the first rail 64. A second holding unit 74 is coupled to this second rail 70 with the intermediary of a second movement mechanism 72 and so forth. For example, the second holding unit 74 gets contact with the upper surface of the frame 15 to suck and hold this frame 15 and moves up and down by the second movement mechanism 72. In addition, the second holding unit 74 moves in the Y-axis direction along the second rail 70.

A second support structure 76 with a gate shape is disposed on the rear side of the first support structure 62. Two sets of cutting units (processing units) 80 are each disposed on the front surface of the second support structure 76 (surface on the side of the first support structure 62) with the intermediary of a Y-axis/Z-axis movement mechanism (indexing feed unit, cutting-in feed unit) 78. The cutting unit 80 each moves in the Y-axis direction (indexing feed) and moves in the Z-axis direction (cutting-in feed) by the corresponding Y-axis/Z-axis movement mechanism 78.

Each cutting unit 80 includes a spindle (not illustrated) that serves as a rotating shaft substantially parallel to the Y-axis direction. A cutting blade 82 with a circular ring shape is mounted to one end side of each spindle. A rotational drive source (not illustrated) such as a motor is coupled to the other end side of each spindle. Furthermore, a nozzle for supplying a cutting liquid such as purified water to the workpiece 11 and the cutting blade 82 is disposed near the cutting blade 82.

While the cutting liquid is supplied from this nozzle, the rotated cutting blade 82 is caused to cut into the workpiece 11 held by the chuck table 56. Thereby, the workpiece 11 can be processed (cut). An imaging unit (camera) 84 for imaging the workpiece 11 held by the chuck table 56 and so forth is disposed at a position adjacent to the cutting unit 80. This imaging unit 84 also moves in the Y-axis direction and moves in the Z-axis direction by the Y-axis/Z-axis movement mechanism 78.

A cleaning unit 86 is disposed at a position on the opposite side to the opening 48a across the opening 48b. The cleaning unit 86 includes a spinner table 88 that sucks and holds the workpiece 11 in a cleaning space with a cylindrical shape. A rotational drive source (not illustrated) that rotates the spinner table 88 at a predetermined speed is coupled to the lower part of the spinner table 88.

A spray nozzle 90 that sprays a fluid for cleaning (typically, mixed fluid obtained by mixing water and air) toward the workpiece 11 held by the spinner table 88 is disposed above the spinner table 88. The workpiece 11 can be cleaned by rotating the spinner table 88 that holds the workpiece 11 and spraying the fluid for cleaning from the spray nozzle 90.

After the workpiece 11 is processed by the cutting unit 80, the frame 15 is sucked and held by the second holding unit 74 and is conveyed to the cleaning unit 86, for example. After the workpiece 11 is cleaned by the cleaning unit 86, for example, the frame 15 is sucked and held by the first holding unit 68 to be placed on the pair of guide rails 60, and thereafter this frame 15 is grasped by the grasping mechanism 68a and is housed in the workpiece storage member 38.

As illustrated in FIG. 5, the upper surface side of the pedestal 48 is covered by a cover 92 and the above-described respective constituent elements are housed inside the cover 92. An opening 92b that vertically penetrates a ceiling 92a of the cover 92 is made in a region directly above the opening 48a. The workpiece storage member 38 of the automated workpiece conveying vehicle 10 is conveyed from outside of the cover 92 into the cover 92 through the opening 92b or from inside of the cover 92 out of the cover 92 through the opening 92b. The opening 92b is not limited to any particular shape and size, but needs to be shaped and sized to allow at least the workpiece storage member 38 to pass therethrough.

The constituent elements of the cutting apparatus 4 described above are connected to a control apparatus 96 (FIG. 5). Typically, the control apparatus 96 is formed of a computer including a processing apparatus such as a CPU and a storing apparatus such as a flash memory, and functions of the control apparatus 96 are implemented by causing the processing apparatus and so forth to operate in accordance with software stored in the storing apparatus.

A receiver 98 that receives a signal for control (control signal) transmitted from the control unit 12 of the conveyance system 2 and a transmitter 100 that transmits a signal for notification (notification signal) to the control unit 12 are further connected to the control apparatus 96. The control apparatus 96 controls the respective constituent elements of the above-described cutting apparatus 4 based on the signal received by the receiver 98 and so forth, for example.

A conduit connecting part 48c (FIG. 5) to which various conduits 21 are connected is disposed in a sidewall of the pedestal 48. Furthermore, doors 92c (FIG. 5) opened and closed in maintenance or the like are disposed in a sidewall of the cover 92. Moreover, an operation panel (not illustrated), a display (not illustrated), and so forth may be disposed on a sidewall of the cover 92.

Figure 7:
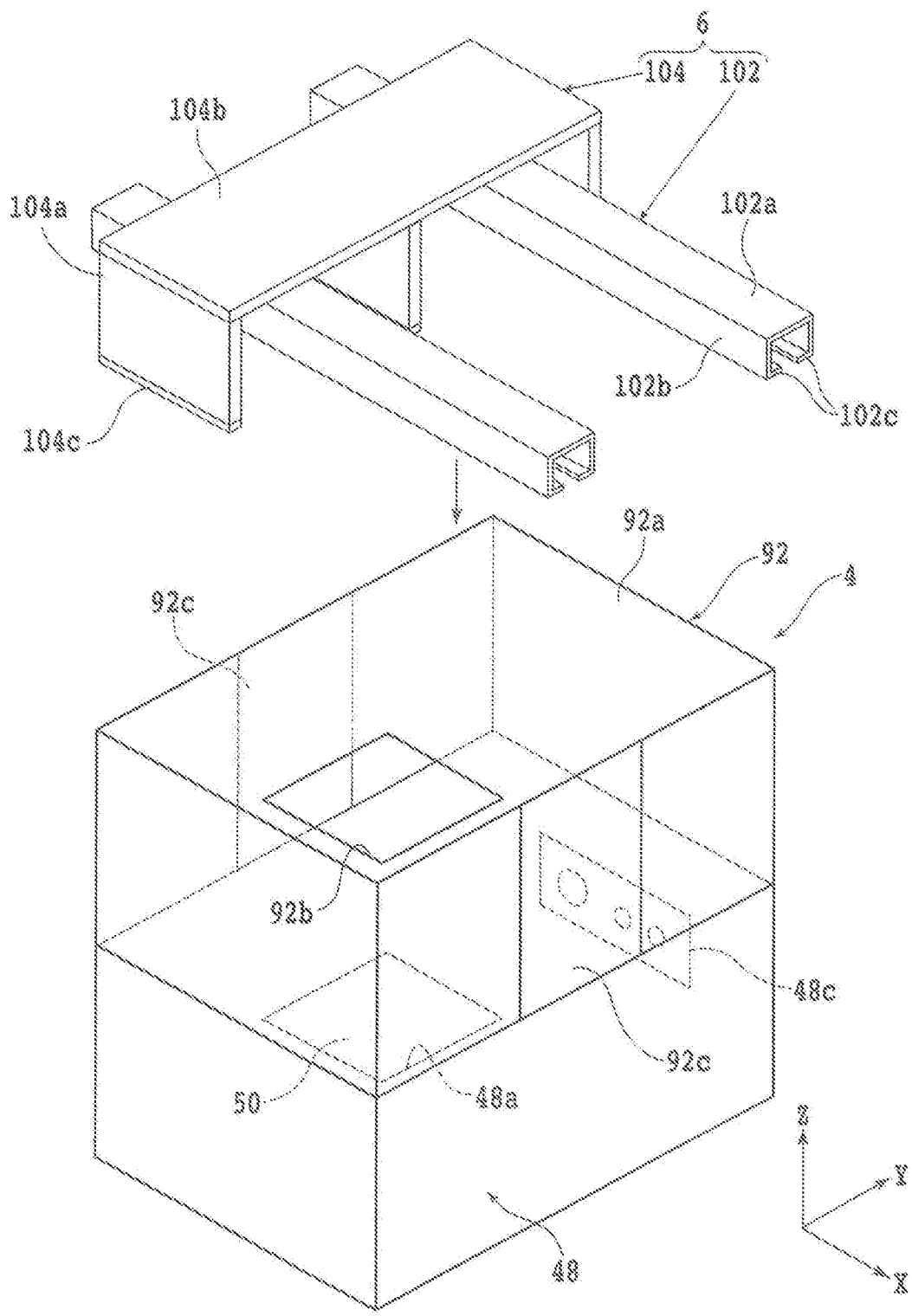
FIG. 7 is a perspective view illustrating how the track is set on the cutting apparatus.

FIG. 7 is a perspective view illustrating how the track 6 of the conveyance system 2 is set on the cutting apparatus 4. As illustrated in FIG. 5 and FIG. 7, the track 6 of the conveyance system 2 according to the present embodiment is mounted to the upper surface side of the ceiling 92a of the cover 92 which the cutting apparatus 4 has. That is, the track 6 is set in a space directly above the cutting apparatus 4.

This eliminates interference of the track 6 with the structures such as the conduit connecting part 48c and the doors 92c disposed in side surfaces of the cutting apparatus 4. That is, the structures of the side surfaces of the cutting apparatus 4 do not need to be considered when the track 6 is designed. For this reason, construction of the conveyance system 2 becomes easy.

The track 6 includes a plurality of rails 102 made of a material such as a metal or the like and connected to each other. Each of the rails 102 has an upper plate 102a having a generally flat upper surface and a pair of side plates 102b having upper ends connected respectively to a pair of side ends of the upper plate 102a. The side plates 102b have respective lower ends to which there are connected side ends of respective lower plates 102c each having a generally flat upper surface.

In other words, each rail 102 includes the upper plate 102a, the two side plates 102b, and the two lower plates 102c. The two lower plates 102c are spaced a predetermined gap from each other so as to be kept out of contact with each other. The protrusive block 39b of the automated workpiece conveying vehicle 10 is inserted in the gap between the two lower plates 102c. With the protrusive block 39b inserted in the gap between the two lower plates 102c, the wheels 41 are placed in contact with the upper surfaces of the lower plates 102c, allowing the automated workpiece conveying vehicle 10 to travel along the rail 102 with the workpiece storage member 38 being disposed below the rail 102.

The track 6 further includes a rail holding structure 104 fixed to an upper portion of the cutting apparatus 4. The rail holding structure 104 includes a plurality of legs 104a and a holder 104b, shaped as a flat plate, connected to upper ends of the legs 104a, which are thus coupled to each other by the holder 104b. Suction members 104c are disposed on respective lower ends of the legs 104a. The suction members 104c include a plurality of suction cups (not illustrated) that adhere under suction to a ceiling 92a of a cover 92 of the cutting apparatus 4, for example.

Therefore, when the suction cups of the suction members 104c adhere under suction to the ceiling 92a of the cover 92, the rail holding structure 104 is fixed to the upper portion of the cutting apparatus 4. The upper plates 102a of the rails 102 are fixed to a lower surface of the holder 104b of the rail holding structure 104. When the rail holding structure 104 is fixed to the upper portion of the cutting apparatus 4, the rails 102 are held by the rail holding structure 104 and have their lower plates 102c facing the ceiling 92a. An electric power supply facility (not illustrated) for supplying electric power to the automated workpiece conveying vehicle 10 is electrically connected to the rails 102.

Figure 8A:
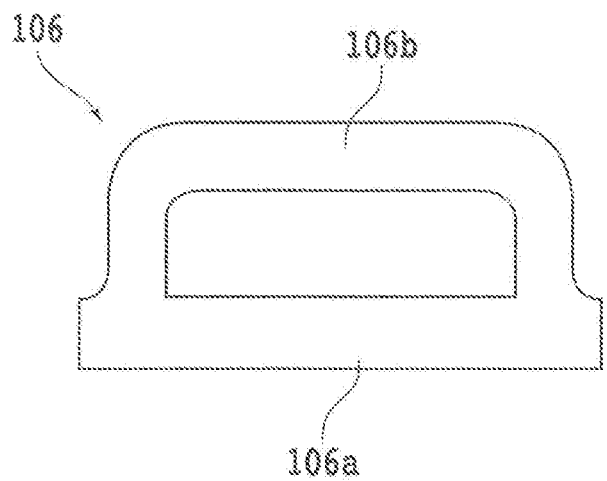
FIG. 8A is a plan view of a rail according to a first example to be used in a track.
Figure 8B:
FIG. 8B is a plan view of a rail according to a second example.
Figure 8C:
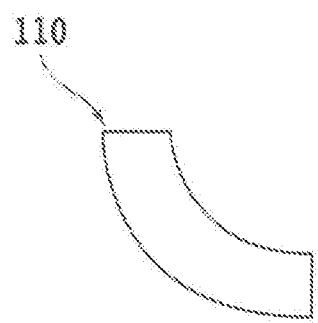
FIG. 8C is a plan view of a rail according to a third example.

FIG. 8A is a plan view of a rail 106 as a first example of the rail 102 to be used in the track 6. FIG. 8B is a plan view of a rail 108 as a second example of the rail 102 to be used in the track 6. FIG. 8C is a plan view of a rail 110 as a third example of the rail 102 to be used in the track 6. The track 6 is made up of a plurality of the rails 106, 108, and 110 joined together, for example, illustrated in FIG. 8A, FIG. 8B, and FIG. 8C.

The rail 106 illustrated in FIG. 8A includes a first route 106a and a second route 106b, and is installed directly over the cutting apparatus 4 or the like. With the rail 106 included in the track 6, while an automated workpiece conveying vehicle 10, i.e., a first automated workpiece conveying vehicle 10, is transferring a workpiece 11 to or from the cutting apparatus 4 using the first route 106a, another automated workpiece conveying vehicle 10, i.e., a second automated workpiece conveying vehicle 10, is allowed to overtake the first automated workpiece conveying vehicle 10 using the second route 106b. As illustrated in FIG. 1, the first route 106a of the rail 106 is disposed directly above the opening 92b of the cutting apparatus 4.

The rail 108 illustrated in FIG. 8B is of a straight shape, whereas the rail 110 illustrated in FIG. 8C is of an arcuate shape, i.e., a curved shape, suitable for a curved corner. The rail 108 is installed directly above the stock unit 8 or the like, for example. The rail 110 is used to interconnect two adjacent rails 106 and 108, for example.

The rail 106 that includes the first route 106a and the second route 106b is held by a large-size rail holding structure 104, i.e., a rail holding structure 112 illustrated in FIG. 1, having three legs 104a capable of withstanding a large weight. On the other hand, the rail 108 that includes a single route is held by a small-size rail holding structure 104, i.e., a rail holding structure 114 illustrated in FIG. 1, having two legs 104a.

The rails 106 and 108 that are disposed directly above the cutting apparatus 4, the stock unit 8, etc. have an information providing part 116 (FIG. 1) such as identification codes typified by two-dimensional codes, wireless tags, or the like. Information that is presented by the information providing part 116 is used to confirm the position of the automated workpiece conveying vehicle 10, for example.

The rails and rail holding structures of the track 6 are not limited to any kinds, numbers, layouts, i.e., how they are connected, etc. For example, any two rails may be interconnected by the rail 106, the rail 108, or the like. Furthermore, the arcuate rail 110 may be replaced with a right-angled rail or the like, for example.

Figure 9A:
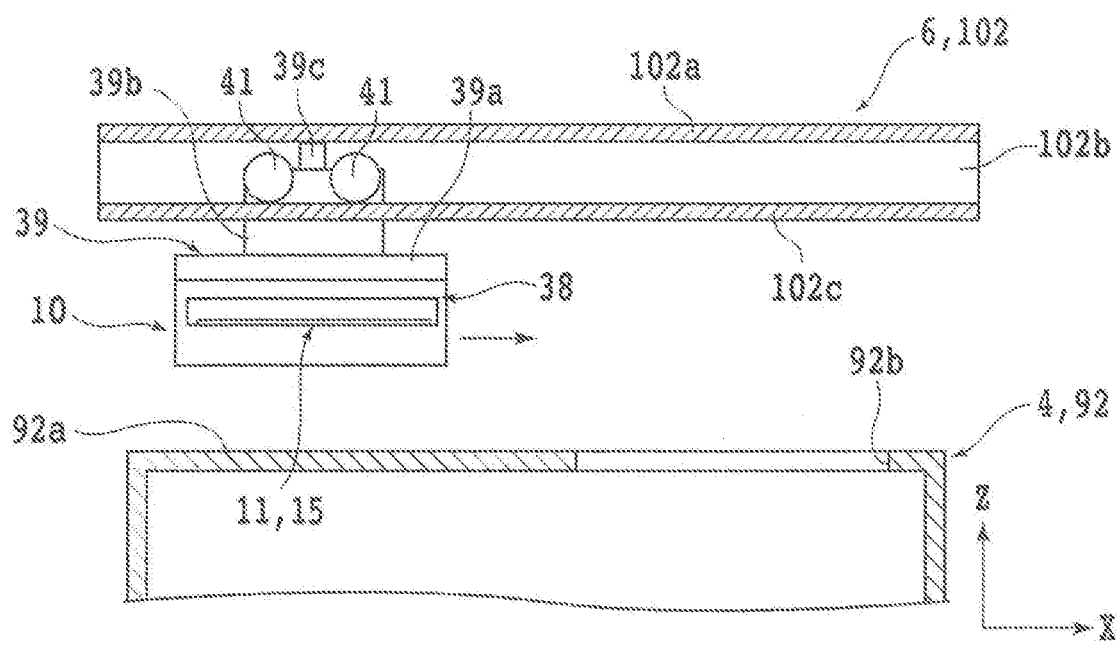
FIG. 9A is a side elevational view, partly in cross section, illustrating the manner in which the automated workpiece conveying vehicle travels in a region above the cutting apparatus, as viewed from a Y-axis direction.

Next, operation of the workpiece storage member 38 of the automated workpiece conveying vehicle 10 as it is moved between a region above the cutting apparatus 4 and the workpiece storage member holding base 50 of the cutting apparatus 4 will be described in detail below. FIG. 9A is a side elevational view, partly in cross section, illustrating the manner in which the automated workpiece conveying vehicle 10 is traveling in the region above the cutting apparatus 4, as viewed from a Y-axis direction, and FIG. 9B is a side elevational view, partly in cross section, illustrating the manner in which the workpiece storage member 38 is lowered, as viewed from the Y-axis direction.

Figure 9B:
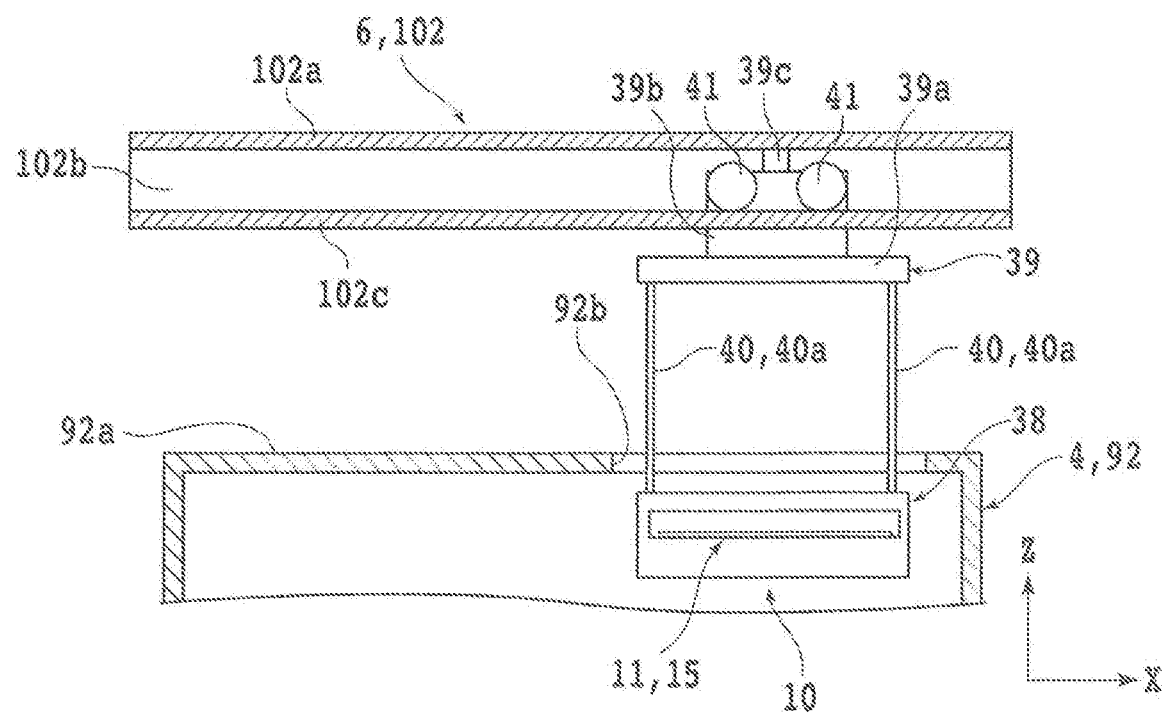
FIG. 9B is a side elevational view, partly in cross section, illustrating the manner in which the workpiece storage member is lowered, as viewed from the Y-axis direction.
Figure 10A:
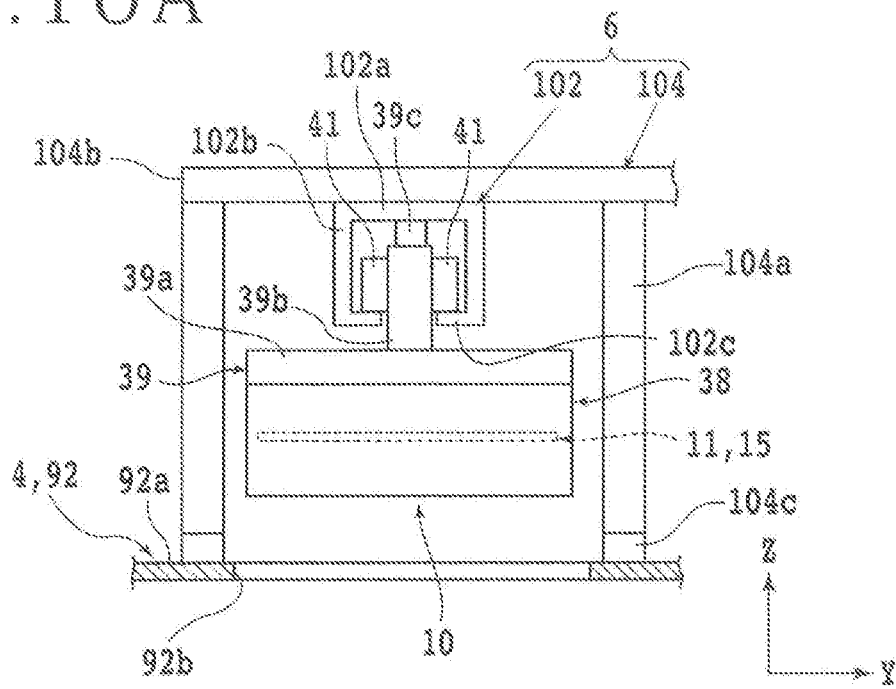
FIG. 10A is a side elevational view, partly in cross section, illustrating the state of FIG. 9A as viewed from an X-axis direction.
Figure 10B:
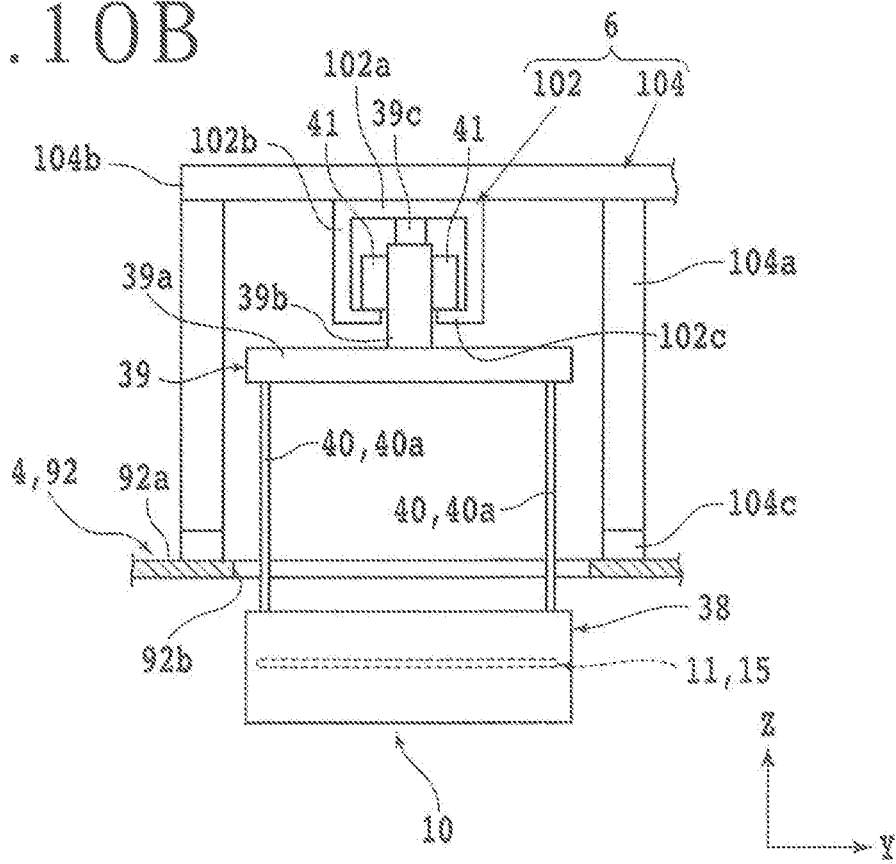
FIG. 10B is a side elevational view, partly in cross section, illustrating the state of FIG. 9B as viewed from the X-axis direction.

FIG. 10A is a side elevational view, partly in cross section, illustrating the state of FIG. 9A as viewed from an X-axis direction, and FIG. 10B is a side elevational view, partly in cross section, illustrating the state of FIG. 9B as viewed from the X-axis direction. After the automated workpiece conveying vehicle 10 has traveled along the rail 102, for example, the automated workpiece conveying vehicle 10 is stopped directly above the opening 92b, as illustrated in FIGS. 9A and 10A.

Then, as illustrated in FIGS. 9B and 10B, the winches of the lifting and lowering mechanisms 40 are operated to draw out the wires 40a. The workpiece storage member 38 is now lowered through the opening 92b until the workpiece storage member 38 is placed on the workpiece storage member holding base 50. The workpiece storage member 38 is now held on the workpiece storage member holding base 50. After the workpiece storage member 38 has been held on the workpiece storage member holding base 50, the workpiece 11 and the frame 15 are unloaded from the workpiece storage member 38.

After the processing of the workpiece 11 on the cutting apparatus 4, for example, has been completed, the workpiece 11 and the frame 15 are loaded into the workpiece storage member 38. Thereafter, the winches of the lifting and lowering mechanisms 40 are operated to wind the wires 40a. The workpiece storage member 38 is now lifted through the opening 92b and unloaded out of the cover 92 into the region above the cutting apparatus 4. After the workpiece storage member 38 has been unloaded into the region above the cutting apparatus 4, the wheels 41 are rotated, enabling the automated workpiece conveying vehicle 10 to travel along the rail 102.

The operation of the workpiece storage member 38 as it is conveyed between the region above the cutting apparatus 4 and the workpiece storage member holding base 50 has been described above. When the workpiece storage member 38 is conveyed between a region above the stock unit 8 and the workpiece storage member holding base 26 of the stock unit 8, the workpiece storage member 38 operates in a similar fashion.

Figure 11:
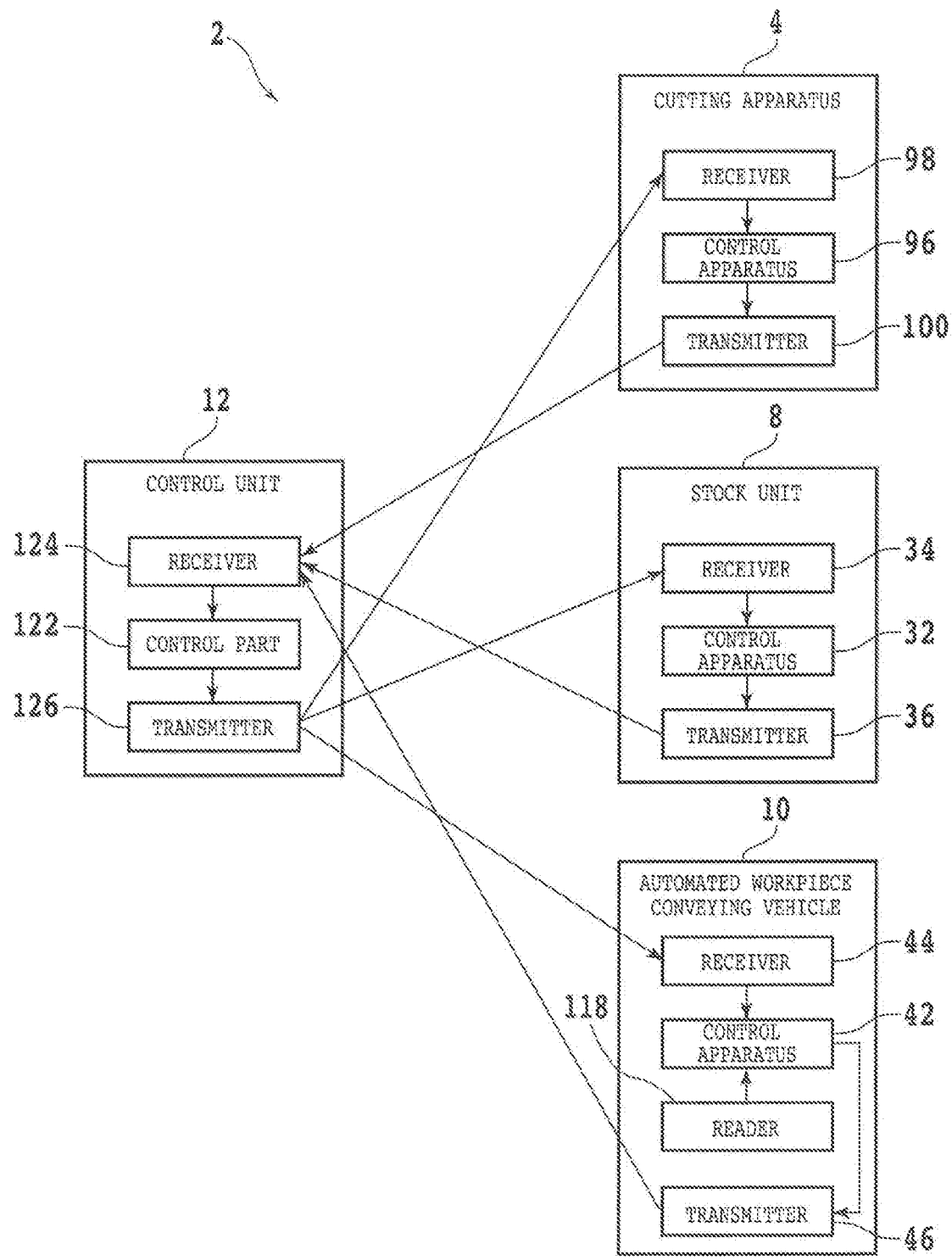
FIG. 11 is a functional block diagram for explaining an example of a control method of the conveyance system according to the first embodiment.

Next, an example of a control method of the conveyance system 2 according to the present embodiment will be described. FIG. 11 is a functional block diagram for explaining the example of the control method of the conveyance system 2. For example, when the situation in which the new workpiece 11 (unprocessed workpiece 11) is necessary occurs, the control apparatus 96 of the cutting apparatus 4 generates a notification signal (workpiece request signal) for notifying this. The notification signal (workpiece request signal) generated by the control apparatus 96 is transmitted from the transmitter 100 to the control unit 12.

As illustrated in FIG. 11, the control unit 12 includes a control part (control signal generating part) 122 that generates a control signal for executing various kinds of control. Typically, the control part 122 is formed of a computer including a processing apparatus such as a CPU and a storing apparatus such as a flash memory, and functions of the control part 122 are implemented by causing the processing apparatus and so forth to operate in accordance with software stored in the storing apparatus.

To this control part 122, a receiver 124 that receives notification signals transmitted from the cutting apparatus 4, the stock unit 8, the automated workpiece conveying vehicle 10, and so forth and a transmitter 126 that transmits control signals to the cutting apparatus 4, the stock unit 8, the automated workpiece conveying vehicle 10, and so forth are connected.

When receiving the notification signal (workpiece request signal) transmitted from the transmitter 100 of the cutting apparatus 4, the receiver 124 of the control unit 12 sends it to the control part 122. When checking the notification signal (workpiece request signal) from the cutting apparatus 4, the control part 122 issues, to the automated workpiece conveying vehicle 10, an instruction to move to a position directly above the opening 16b of the stock unit 8 and convey the workpiece storage member 38 to the workpiece storage member holding base 26 of the stock unit 8. Specifically, the control part 122 generates a control signal (first conveyance instruction signal) equivalent to this instruction and transmits it from the transmitter 126 to the automated workpiece conveying vehicle 10.

When receiving the control signal (first conveyance instruction signal) from the control unit 12, the receiver 44 of the automated workpiece conveying vehicle 10 sends it to the control apparatus 42. The control apparatus 42 controls operation of the wheels (traveling mechanism) 41 and so forth based on this control signal (first conveyance instruction signal) and causes the automated workpiece conveying vehicle 10 to travel along the track 6.

As illustrated in FIG. 11, a reader 118 for reading information of the information providing part 116 set on the track 6 is connected to the control apparatus 42 of the automated workpiece conveying vehicle 10. Thus, the control apparatus 42 can check its position (a position of the automated workpiece conveying vehicle 10) by reading the information of the information providing part 116 by the reader 118.

When the control apparatus 42 confirms that it, i.e., the automated workpiece conveying vehicle 10, has moved to a position directly above the opening 16b of the stock unit 8, the control apparatus 42 operates the winches of the lifting and lowering mechanisms 40 to draw out the wires 40a. The workpiece storage member 38 is now lowered through the opening 16b until the workpiece storage member 38 is placed on the workpiece storage member holding base 26.

After having placed the workpiece storage member 38 on the workpiece storage member holding base 26, the control apparatus 42 generates a notification signal, i.e., a first conveyance completion signal, for indicating that the conveyance of the workpiece storage member 38 to the stock unit 8 is completed. The notification signal (first conveyance completion signal) generated by the control apparatus 42 is transmitted from the transmitter 46 to the control unit 12.

When the receiver 124 of the control unit 12 receives the notification signal (first conveyance completion signal) transmitted from the transmitter 46 of the automated workpiece conveying vehicle 10, the receiver 124 sends the received notification signal to the control part 122. When the control part 122 confirms the notification signal (first conveyance completion signal) from the automated workpiece conveying vehicle 10, the control part 122 issues an instruction to the stock unit 8 to load a new workpiece 11 into the workpiece storage member 38 on the workpiece storage member holding base 26. Specifically, the control part 122 generates a control signal (first loading instruction signal) representing the instruction, and transmits the control signal from the transmitter 126 to the stock unit 8.

When the receiver 34 of the stock unit 8 receives the control signal (first loading instruction signal) from the control unit 12, the receiver 34 sends the received control signal to the control apparatus 32. Based on the control signal (first loading instruction signal), the control apparatus 32 controls operation of the first raising-lowering mechanism, the push-pull arm 22, the pair of guide rails 24, the second raising-lowering mechanism, etc. to load a new workpiece 11 into the workpiece storage member 38.

When the new workpiece 11 is loaded into the workpiece storage member 38, the control apparatus 32 generates a notification signal (first loading completion signal) for notifying that the loading of the new workpiece 11 into the workpiece storage member 38 is completed. The notification signal (first loading completion signal) generated by the control apparatus 32 is transmitted from the transmitter 36 to the control unit 12.

When the receiver 124 of the control unit 12 receives the notification signal (first loading completion signal) transmitted from the transmitter 36 of the stock unit 8, the receiver 124 sends the received notification signal to the control part 122. When the control part 122 confirms the notification signal (first loading completion signal) from the stock unit 8, the control part 122 issues an instruction to the automated workpiece conveying vehicle 10 to move to a position directly above the opening 92b of the cutting apparatus 4 and convey the workpiece storage member 38 to the workpiece storage member holding base 50 of the cutting apparatus 4. Specifically, the control part 122 generates a control signal (second conveyance instruction signal) representing the instruction and transmits the control signal from the transmitter 126 to the automated workpiece conveying vehicle 10.

When the receiver 44 of the automated workpiece conveying vehicle 10 receives the control signal (second conveyance instruction signal) from the control unit 12, the receiver 44 sends the received control signal to the control apparatus 42. Based on the control signal, i.e., the second conveyance instruction signal, the control apparatus 42 lifts the workpiece storage member 38 to carry it out from the stock unit 8. Thereafter, the control apparatus 42 controls operation of the wheels 41, etc. to propel the automated workpiece conveying vehicle 10 along the track 6.

When the control apparatus 42 confirms that it, i.e., the automated workpiece conveying vehicle 10, has moved to a position directly above the opening 92b of the cutting apparatus 4, the control apparatus 42 operates the winches of the lifting and lowering mechanisms 40 to draw out the wires 40a. The workpiece storage member 38 is now lowered through the opening 92b until the workpiece storage member 38 is placed on the workpiece storage member holding base 50.

After having placed the workpiece storage member 38 on the workpiece storage member holding base 50, the control apparatus 42 generates a notification signal, i.e., a second conveyance completion signal, for indicating that the conveyance of the workpiece storage member 38 to the cutting apparatus 4 is completed. The notification signal (second loading completion signal) generated by the control apparatus 42 is transmitted from the transmitter 46 to the control unit 12.

When the receiver 124 of the control unit 12 receives the notification signal (second loading completion signal) transmitted from the transmitter 46 of the automated workpiece conveying vehicle 10, the receiver 124 sends the received notification signal to the control part 122. When the control part 122 confirms the notification signal (second loading completion signal) from the automated workpiece conveying vehicle 10, the control part 122 issues an instruction to the cutting apparatus 4 to unload the new workpiece 11 out of the workpiece storage member 38 on the workpiece storage member holding base 50. Specifically, the control part 122 generates a control signal (first unloading instruction signal) representing the instruction and transmits the control signal from the transmitter 126 to the cutting apparatus 4.

When the receiver 98 of the cutting apparatus 4 receives the control signal (first unloading instruction signal) from the control unit 12, the receiver 98 sends the received control signal to the control apparatus 96. The control apparatus 96 controls operation of the constituent elements on the basis of the control signal (first unloading instruction signal) to unload the new workpiece 11 out of the workpiece storage member 38.

When the new workpiece 11 is unloaded from the workpiece storage member 38, the control apparatus 96, for example, generates a notification signal (first unloading completion signal) for notifying that the unloading of the workpiece 11 out of the workpiece storage member 38 is completed. The notification signal (first unloading completion signal) generated by the control apparatus 96 is transmitted from the transmitter 100 to the control unit 12.

According to the procedure described above, a workpiece 11 stored in the stock unit 8 can be conveyed to any cutting apparatus 4. The procedure for conveying the workpiece 11 from the stock unit 8 to a cutting apparatus 4 has mainly been described above. However, a procedure for conveying the workpiece 11 from the cutting apparatus 4 to the stock unit 8 is also similarly carried out.

Specifically, for example, when the processing of a workpiece 11 is completed, the control apparatus 96 of the cutting apparatus 4 generates a notification signal (processing completion signal) for notifying the completion of the processing. The notification signal (processing completion signal) generated by the control apparatus 96 is transmitted from the transmitter 100 to the control unit 12. When the receiver 124 of the control unit 12 receives the notification signal (processing completion signal) transmitted from the transmitter 100, the receiver 124 sends the received notification signal to the control part 122.

When the control part 122 confirms the notification signal (processing completion signal) from the cutting apparatus 4, the control part 122 issues an instruction to the automated workpiece conveying vehicle 10 to move to a position directly above the opening 92b of the cutting apparatus 4 and convey the workpiece storage member 38 to the workpiece storage member holding base 50 of the cutting apparatus 4. Specifically, the control part 122 generates a control signal (third conveyance instruction signal) representing the instruction and transmits the generated control signal from the transmitter 126 to the automated workpiece conveying vehicle 10.

When the receiver 44 of the automated workpiece conveying vehicle 10 receives the control signal (third conveyance instruction signal) from the control unit 12, the receiver 44 sends the received control signal to the control apparatus 42. Based on the control signal (third conveyance instruction signal), the control apparatus 42 controls operation of the wheels (traveling mechanisms) 41, etc. to propel the automated workpiece conveying vehicle 10 along the track 6.

When the control apparatus 42 confirms that it, i.e., the automated workpiece conveying vehicle 10, has moved to a position directly above the opening 92b of the cutting apparatus 4, the control apparatus 42 operates the winches of the lifting and lowering mechanisms 40 to draw out the wires 40a. The workpiece storage member 38 is now lowered through the opening 92b until the workpiece storage member 38 is placed on the workpiece storage member holding base 50.

After having placed the workpiece storage member 38 on the workpiece storage member holding base 50, the control apparatus 42 generates a notification signal, i.e., a third conveyance completion signal, for indicating that the conveyance of the workpiece storage member 38 to the cutting apparatus 4 is completed. The notification signal (the third conveyance completion signal) generated by the control apparatus 42 is transmitted from the transmitter 46 to the control unit 12.

When the receiver 124 of the control unit 12 receives the notification signal (third conveyance completion signal) transmitted from the transmitter 46 of the automated workpiece conveying vehicle 10, the receiver 124 sends the received notification signal to the control part 122. When the control part 122 confirms the notification signal (third conveyance completion signal) from the automated workpiece conveying vehicle 10, the control part 122 issues an instruction to the cutting apparatus 4 to load the processed workpiece 11 into the workpiece storage member 38 on the workpiece storage member holding base 50. Specifically, the control part 122 generates a control signal (second loading instruction signal) representing the instruction and transmits the control signal from the transmitter 126 to the cutting apparatus 4.

When the receiver 98 of the cutting apparatus 4 receives the control signal (second loading instruction signal) from the control unit 12, the receiver 98 sends the received control signal to the control apparatus 96. Based on the control signal (second loading instruction signal), the control apparatus 96 controls operation of the constituent elements to load the processed workpiece 11 into the workpiece storage member 38.

When the processed workpiece 11 is loaded into the workpiece storage member 38, the control apparatus 96 generates a notification signal (second loading completion signal) for notifying that the loading of the workpiece 11 into the workpiece storage member 38 is completed. The notification signal (second loading completion signal) generated by the control apparatus 96 is transmitted from the transmitter 100 to the control unit 12.

When the receiver 124 of the control unit 12 receives the notification signal (second loading completion signal) transmitted from the transmitter 100 of the cutting apparatus 4, the receiver 124 sends the received notification signal to the control part 122. When the control part 122 confirms the notification signal (second loading completion signal) from the cutting apparatus 4, the control part 122 issues an instruction to the automated workpiece conveying vehicle 10 to move the workpiece storage member 38 to a position directly above the opening 16b of the stock unit 8 and convey the workpiece storage member 38 to the workpiece storage member holding base 26 of the stock unit 8. Specifically, the control part 122 generates a control signal (fourth conveyance instruction signal) representing the instruction and transmits the control signal from the transmitter 126 to the automated workpiece conveying vehicle 10.

When the receiver 44 of the automated workpiece conveying vehicle 10 receives the control signal (fourth conveyance instruction signal) from the control unit 12, the receiver 44 sends the received control signal to the control apparatus 42. Based on the control signal, i.e., the fourth conveyance instruction signal, the control apparatus 42 lifts the workpiece storage member 38 to carry it out from the cutting apparatus 4. Thereafter, the control apparatus 42 controls operation of the wheels 41, etc. to propel the automated workpiece conveying vehicle 10 along the track 6.

When the control apparatus 42 confirms that it, i.e., the automated workpiece conveying vehicle 10, has moved to a position directly above the opening 16b of the stock unit 8, the control apparatus 42 operates the winches of the lifting and lowering mechanisms 40 to draw out the wires 40a. The workpiece storage member 38 is now lowered through the opening 16b until the workpiece storage member 38 is placed on the workpiece storage member holding base 26.

After having placed the workpiece storage member 38 on the workpiece storage member holding base 26, the control apparatus 42 generates a notification signal, i.e., a fourth conveyance completion signal, for indicating that the conveyance of the workpiece storage member 38 to the stock unit 8 is completed. The notification signal (fourth conveyance completion signal) generated by the control apparatus 42 is transmitted from the transmitter 46 to the control unit 12.

When the receiver 124 of the control unit 12 receives the notification signal (fourth conveyance completion signal) transmitted from the transmitter 46 of the automated workpiece conveying vehicle 10, the receiver 124 sends the received notification signal to the control part 122. When the control part 122 confirms the notification signal (fourth conveyance completion signal) from the automated workpiece conveying vehicle 10, the control part 122 issues an instruction to the stock unit 8 to unload the processed workpiece 11 out of the workpiece storage member 38 on the workpiece storage member holding base 26. Specifically, the control part 122 generates a control signal (second unloading instruction signal) representing the instruction and transmits the control signal from the transmitter 126 to the stock unit 8.

When the receiver 34 of the stock unit 8 receives the control signal (second unloading instruction signal) from the control unit 12, the receiver 34 sends the received control signal to the control apparatus 32. Based on the control signal (second unloading instruction signal), the control apparatus 32 controls operation of the first raising-lowering mechanism, the push-pull arm 22, the pair of guide rails 24, the second raising-lowering mechanism, etc. to unload the processed workpiece 11 out of the workpiece storage member 38.

When the processed workpiece 11 is unloaded from the workpiece storage member 38, the control apparatus 32, for example, generates a notification signal (second unloading completion signal) for notifying that the unloading of the workpiece 11 out of the workpiece storage member 38 is completed. The notification signal (second unloading completion signal) generated by the control apparatus 32 is transmitted from the transmitter 36 to the control unit 12. According to the procedure described above, the workpiece 11 processed by the cutting apparatus 4 can be conveyed to the stock unit 8.

The procedure described above can be changed arbitrarily within a range in which the workpiece 11 can be conveyed appropriately. For example, a plurality of steps included in the above procedure may be carried out simultaneously, or the order of steps may be switched around within a range in which the steps thus switched around pose no difficulty in conveying the workpiece 11. Similarly, arbitrary steps may be added, changed, or omitted within a range in which the steps thus added, changed, or omitted pose no difficulty in conveying the workpiece 11.

As described above, the conveyance system 2 according to the present embodiment includes the track 6 extending over the plurality of cutting apparatuses (i.e., processing apparatus) 4, and fixed to the upper portions of the cutting apparatus 4, the automated workpiece conveying vehicle (i.e., automated conveying vehicle) 10 for traveling on the track 6, with the workpiece storage member 38 disposed below the track 6, the automated workpiece conveying vehicle 10 including the lifting and lowering mechanisms 40 for lifting and lowering the workpiece storage member 38 having the space (i.e., housing space) 38a for housing the workpiece 11 therein while suspending the workpiece storage member 38 from above, and the stock unit 8 having the workpiece storage member holding base 26 for holding the workpiece storage member 38 thereon when the workpiece 11 is transferred from the cassette (i.e., workpiece stocker) 20 housing workpieces 11 therein to the workpiece storage member 38.

Consequently, after the workpiece 11 has been conveyed from the cassette 20 to the workpiece storage member 38 held on the workpiece storage member holding base 26, the automated workpiece conveying vehicle 10 travels on the track 6, such that workpieces 11 can be conveyed to the plurality of respective cutting apparatuses 4.

Moreover, in the conveyance system 2 according to the present embodiment, the track 6 is fixed to the upper portions of the cutting apparatus 4. when the conveyance system 2 including the track 6 is to be designed, it is not necessary to take into account the structure of side surfaces of each processing apparatus 4. In other words, it is easy to construct the conveyance system 2.

Second Embodiment

According to the present embodiment, a track and an automated workpiece conveying vehicle (i.e., an automated conveying vehicle) having structures different from the track 6 and the automated workpiece conveying vehicle (i.e., the automated conveying vehicle) 10 according to the first embodiment will be described below. The conveyance system incorporating the track and the automated workpiece conveying vehicle according to the present embodiment has a basic structure that is the same as the basic structure of the conveyance system 2 according to the first embodiment. Therefore, common structural details are denoted by identical reference characters, and their detailed description will be omitted below.

Figure 12A:
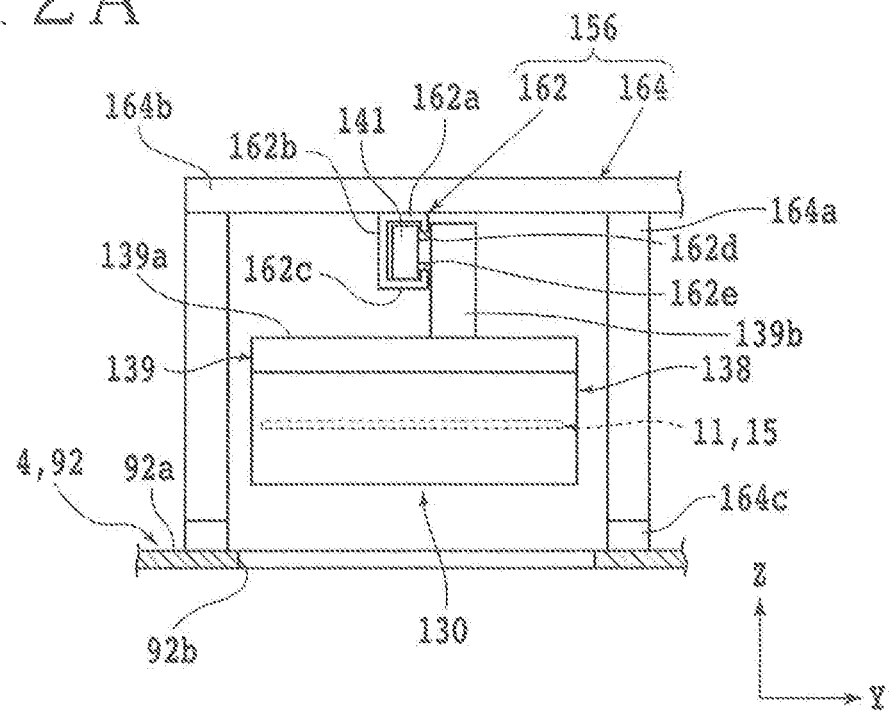
FIG. 12A and FIG. 12B are side elevational views, partly in cross section, illustrating a configurational example of an automated workpiece conveying vehicle or the like according to the second embodiment.
Figure 12B:
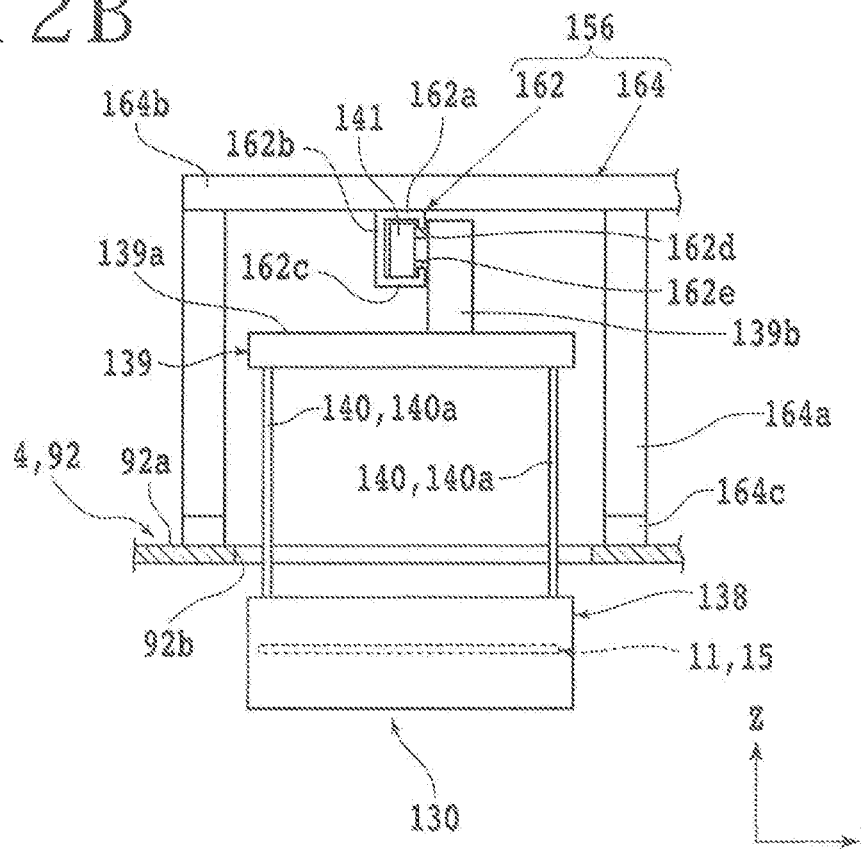

FIGS. 12A and 12B are side elevational views, partly in cross section, illustrating a structural example of an automated workpiece conveying vehicle 130, etc. according to the present embodiment. As illustrated in FIGS. 12A and 12B, the automated workpiece conveying vehicle 130 according to the present embodiment includes a workpiece storage member 138, shaped as a rectangular parallelepiped, for housing a single workpiece 11 (and a frame 15), for example, therein. The workpiece storage member 138 may be structurally identical to the workpiece storage member 38 according to the first embodiment.

The automated workpiece conveying vehicle 130 also includes a traveling member 139 disposed over the workpiece storage member 138. The traveling member 139 includes a base 139a shaped as a flat plate and having a size which is approximately the same as the workpiece storage member 138 as viewed in plan. Lifting and lowering mechanisms 140 (FIG. 12B) are disposed on the lower surfaces of regions corresponding to the respective four corners of the base 139a. Each of the lifting and lowering mechanisms 140 includes a wire 140a having a tip end connected to the upper surface of the workpiece storage member 138 and a winch (not illustrated) fixed to the upper surface of the workpiece storage member 138, for winding the wire 140a, and is able to lift and lower the workpiece storage member 138 while suspending the workpiece storage member 138.

Specifically, the traveling member 139 is coupled from above to the workpiece storage member 138 by the lifting and lowering mechanisms 140. When the winches are operated to unwind the wires 140a, for example, the workpiece storage member 138 is lowered from the traveling member 139, as illustrated in FIG. 12B. On the other hand, when the winches are operated to wind the wires 140a, the workpiece storage member 138 is lifted toward the traveling member 139.

A protrusive block 139b shaped as a rectangular parallelepiped is disposed on an upper surface of the base 139a. A plurality of wheels (i.e., traveling mechanisms) 141 are mounted on a side surface of the protrusive block 139b. Each of the wheels 141 is coupled to a rotary actuator such as an electric motor or the like, and can be rotated thereby. A terminal (not illustrated) is disposed on the protrusive block 139b at a position adjacent to the wheels 141. Various components of the automated workpiece conveying vehicle 130 are supplied with electric power from an external source through the terminal. According to the present embodiment, the wheels 141 are mounted on one side surface of the protrusive block 139b which faces away from the Y-axis direction.

The base 139a houses therein a control apparatus (not illustrated) for controlling operation of the automated workpiece conveying vehicle 10. The control apparatus is typically in the form of a computer including a processing apparatus such as a CPU and a storage apparatus such as a flash memory or the like. The control apparatus is functionally implemented by operating the processing apparatus, etc. according to software stored in the storage apparatus.

To the control apparatus, there are electrically connected a receiver (not illustrated) for receiving signals for control, i.e., control signals, transmitted from the control unit 12 of the conveyance system and a transmitter (not illustrated) for transmitting signals for notification, i.e., notification signals, to the control unit 12. The control apparatus controls operation of the automated workpiece conveying vehicle 130 on the basis of signals received by the receiver. Furthermore, the control apparatus transmits necessary signals through the transmitter to the control unit 12.

The components of the automated workpiece conveying vehicle 130 may be electrically connected to a secondary battery, for example. In such a case, the components of automated workpiece conveying vehicle 130 can be operated by electric power supplied from the secondary battery. The secondary battery is supplied (charged) with electric power in a contact fashion using the terminal, for example. However, the secondary battery may be charged in a non-contact fashion (a wireless or contact-free manner) not using the terminal, etc.

A track 156 according to the present embodiment includes a plurality of rails 162 made of a material such as a metal or the like and connected to each other. Each of the rails 162 has an upper plate 162a having a generally flat upper surface and a first side plate 162b having an upper end connected to a side end of the upper plate 162a. A lower plate 162c that has a generally flat upper surface has a side end connected to a lower end of the first side plate 162b. A second side plate 162d has an upper end connected to the other side end of the upper plate 162a, and a third side plate 162e has a lower end connected to the other side end of the lower plate 162c.

In other words, each rail 162 includes the upper plate 162a, the first side plate 162b, the lower plate 162c, the second side plate 162d, and the third side plate 162e. The second side plate 162d and the third side plate 162e are spaced a predetermined gap from each other so as to be kept out of contact with each other. The wheels 141 have respective rotational shafts inserted in the gap between the second side plate 162d and the third side plate 162e. The wheels 141 are placed in contact with the upper surface of the lower plate 162c, allowing the automated workpiece conveying vehicle 130 to travel along the rail 162 with the workpiece storage member 138 being disposed below the rail 162.

The track 156 further includes a rail holding structure 164 fixed to an upper portion of the cutting apparatus 4. The rail holding structure 164 includes a plurality of legs 164a and a holder 164b, shaped as a flat plate, connected to upper ends of the legs 164a, which are thus coupled to each other by the holder 164b. Suction members 164c are disposed on respective lower ends of the legs 164a. The suction members 164c include a plurality of suction cups (not illustrated) that adhere under suction to the ceiling 92a of the cover 92 of the cutting apparatus 4, for example.

Therefore, when the suction cups of the suction members 164c adhere under suction to the ceiling 92a of the cover 92, the rail holding structure 164 is fixed to the upper portion of the cutting apparatus 4. The upper plates 162a of the rails 162 are fixed to a lower surface of the holder 164b of the rail holding structure 164. When the rail holding structure 164 is fixed to the upper portion of the cutting apparatus 4, the rails 162 are held by the rail holding structure 164 and have their lower plates 162c facing the ceiling 92a. An electric power supply facility (not illustrated) for supplying electric power to the automated workpiece conveying vehicle 10 is electrically connected to the rails 162.

Third Embodiment

In the present embodiment, a stock unit with a different structure from the stock unit 8 will be described. The basic configuration of a conveyance system and so forth into which the stock unit of the present embodiment is incorporated is the same as the conveyance system 2 and so forth according to the first embodiment. Thus, a common constituent element is given the same numeral and detailed description is omitted.

Figure 13:
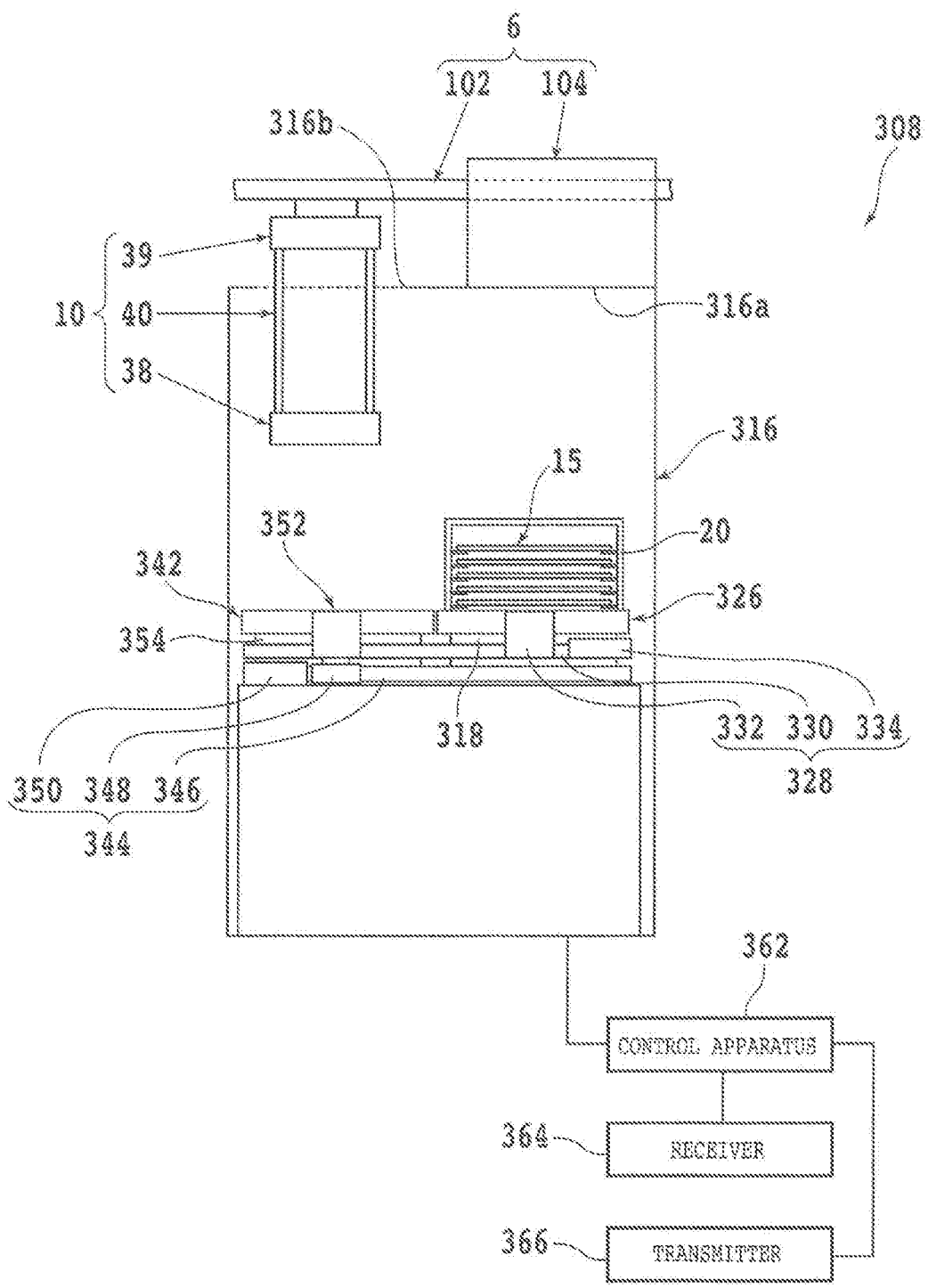
FIG. 13 is a side view schematically illustrating a configuration example of a stock unit according to a third embodiment.
Figure 14:
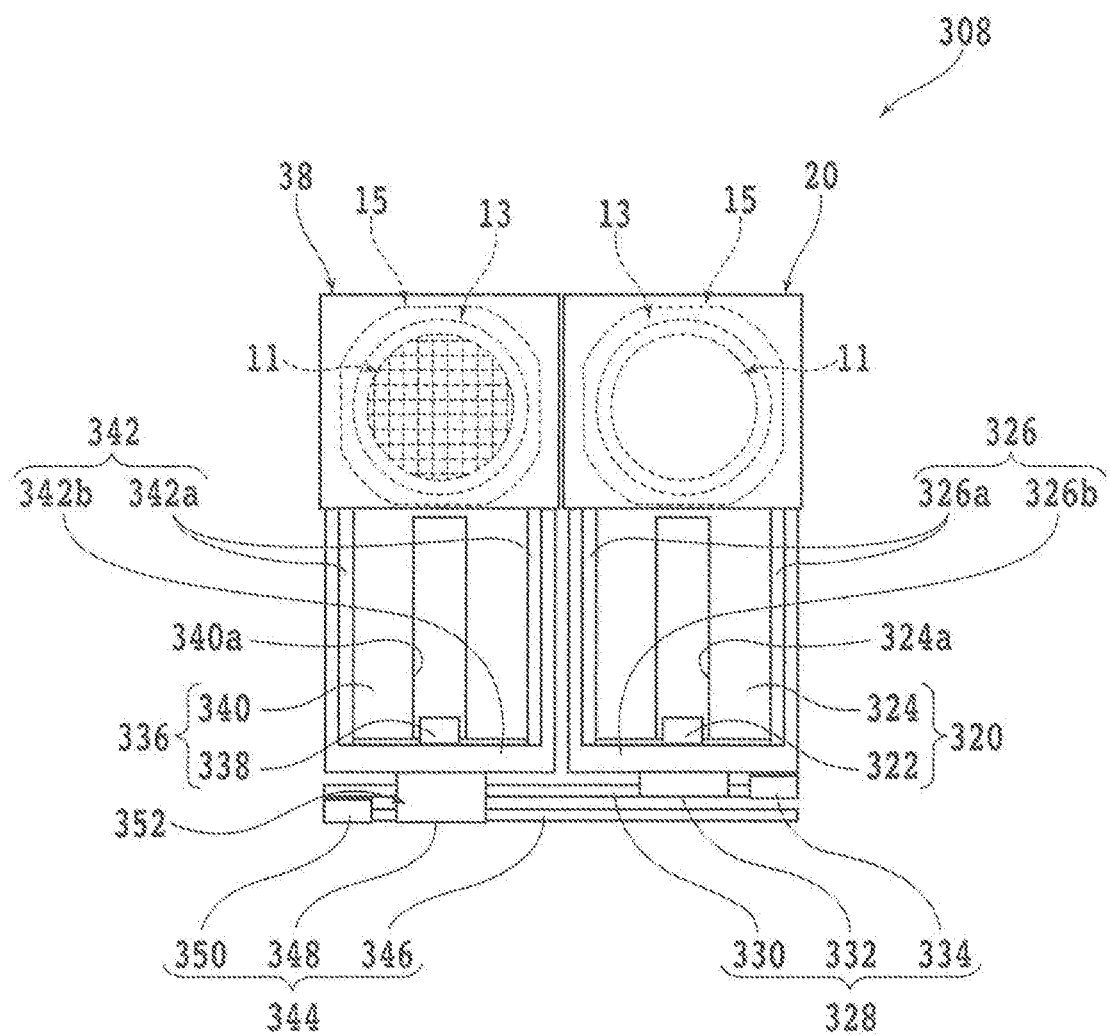
FIG. 14 is a plan view schematically illustrating the structure of the inside of the stock unit according to the third embodiment.

FIG. 13 is a side view schematically illustrating a configuration example of a stock unit 308 according to the present embodiment, and FIG. 14 is a plan view schematically illustrating the structure of the inside of the stock unit 308. As illustrated in FIG. 13, the stock unit 308 includes a casing 316 that houses various constituent elements. In this FIG. 13, only the contour of the casing 316 is illustrated for convenience of description.

In the casing 316, a cassette holding base 318 that moves up and down by a first raising-lowering mechanism (not illustrated) of a ball screw type is disposed, for example. The cassette (workpiece stocker) 20 that can house plural workpieces 11 is placed on the upper surface of the cassette holding base 318. This cassette 20, for example, houses the workpieces 11 in the state of being supported by the frame 15 with the intermediary of the tape 13 as described above.

As illustrated in FIG. 14, a first workpiece movement unit 320 that grasps and moves the frame 15 is disposed at a first position that faces the cassette holding base 318 (cassette 20). The first workpiece movement unit 320 includes a grasping part 322 that vertically grasps the frame 15 and a drive part 324 that moves the grasping part 322 in a substantially horizontal direction.

A slit-shaped opening 324a that extends substantially horizontally toward the cassette holding base 318 is formed in the upper surface of the drive part 324, and the drive part 324 moves the grasping part 322 in a first direction along this opening 324a. That is, the grasping part 322 moves in such a manner as to get closer to the cassette holding base 318 or get further away from the cassette holding base 318.

Thus, for example, when the height of the frame 15 housed in the cassette 20 is adjusted to the height of the grasping part 322 by the first raising-lowering mechanism and the grasping part 322 is brought close to the cassette holding base 318, the frame 15 in the cassette 20 can be grasped by the grasping part 322. Furthermore, when the grasping part 322 is brought further away from the cassette holding base 318 after the frame 15 in the cassette 20 is grasped by the grasping part 322, the frame 15 can be drawn out to the outside of the cassette 20.

Around the first workpiece movement unit 320, a first temporary putting base 326 on which the frame 15 carried out from the cassette 20 is temporarily put is disposed. The first temporary putting base 326 includes a pair of guide parts 326a that are each long in the first direction and a base part 326b that is long in a second direction that is perpendicular to the first direction and is horizontal. The pair of guide parts 326a are coupled through the base part 326b in such a manner that the longitudinal directions thereof are parallel to each other. The frame 15 drawn out from the cassette 20 by the first workpiece movement unit 320 is placed on the pair of guide parts 326a.

The first temporary putting base 326 is supported by a first temporary putting base movement part 328 that moves this first temporary putting base 326 in the second direction. The first temporary putting base movement part 328 includes a guide rail 330 that is long in the second direction. A moving member 332 is slidably attached to the guide rail 330.

A nut part (not illustrated) is disposed on the moving member 332 and a ball screw (not illustrated) substantially parallel to the guide rail 330 is screwed to this nut part. A pulse motor 334 is coupled to one end of the ball screw. When the ball screw is rotated by the pulse motor 334, the moving member 332 moves in the second direction along the guide rail 330.

The base part 326b of the first temporary putting base 326 is fixed to the upper part of the moving member 332. Thus, the first temporary putting base 326 moves in the second direction together with the moving member 332. The first temporary putting base movement part 328 is configured to be capable of moving the first temporary putting base 326 between the first position and a second position adjacent to this first position.

A second workpiece movement unit 336 that grasps and moves the frame 15 is disposed at the second position. That is, the second workpiece movement unit 336 is disposed adjacent to the first workpiece movement unit 320. The structure of the second workpiece movement unit 336 is the same as the structure of the first workpiece movement unit 320.

Specifically, the second workpiece movement unit 336 includes a grasping part 338 that vertically grasps the frame 15 and a drive part 340 that moves the grasping part 338 in a substantially horizontal direction. A slit-shaped opening 340a that is long in the first direction is formed in the upper surface of the drive part 340 and the drive part 340 moves the grasping part 338 along this opening 440a.

Around the second workpiece movement unit 336, a second temporary putting base 342 having the same structure as the first temporary putting base 326 is disposed. That is, the second temporary putting base 342 includes a pair of guide parts 342a that are each long in the first direction and a base part 342b that is long in the second direction, which is perpendicular to the first direction and is horizontal. The pair of guide parts 342a are coupled through the base part 342b in such a manner that the longitudinal directions thereof are parallel to each other.

The second temporary putting base 342 is supported by a second temporary putting base movement part 344 that moves this second temporary putting base 342 in the second direction and the vertical direction. The second temporary putting base movement part 344 includes a guide rail 346 that is long in the second direction. A moving member 348 is slidably attached to the guide rail 346.

A nut part (not illustrated) is disposed on the moving member 348 and a ball screw (not illustrated) substantially parallel to the guide rail 346 is screwed to this nut part. A pulse motor 350 is coupled to one end of the ball screw. When the ball screw is rotated by the pulse motor 350, the moving member 348 moves in the second direction along the guide rail 346.

The base part 342b of the second temporary putting base 342 is fixed to the upper part of the moving member 348 with the intermediary of a raising-lowering mechanism 352 formed of an air cylinder and so forth. Thus, the second temporary putting base 342 moves in the second direction together with the moving member 348 and the raising-lowering mechanism 352 and moves up and down by the raising-lowering mechanism 352. The second temporary putting base movement part 344 is configured to be capable of moving the second temporary putting base 342 between the second position and the first position adjacent to this second position.

Figure 15:
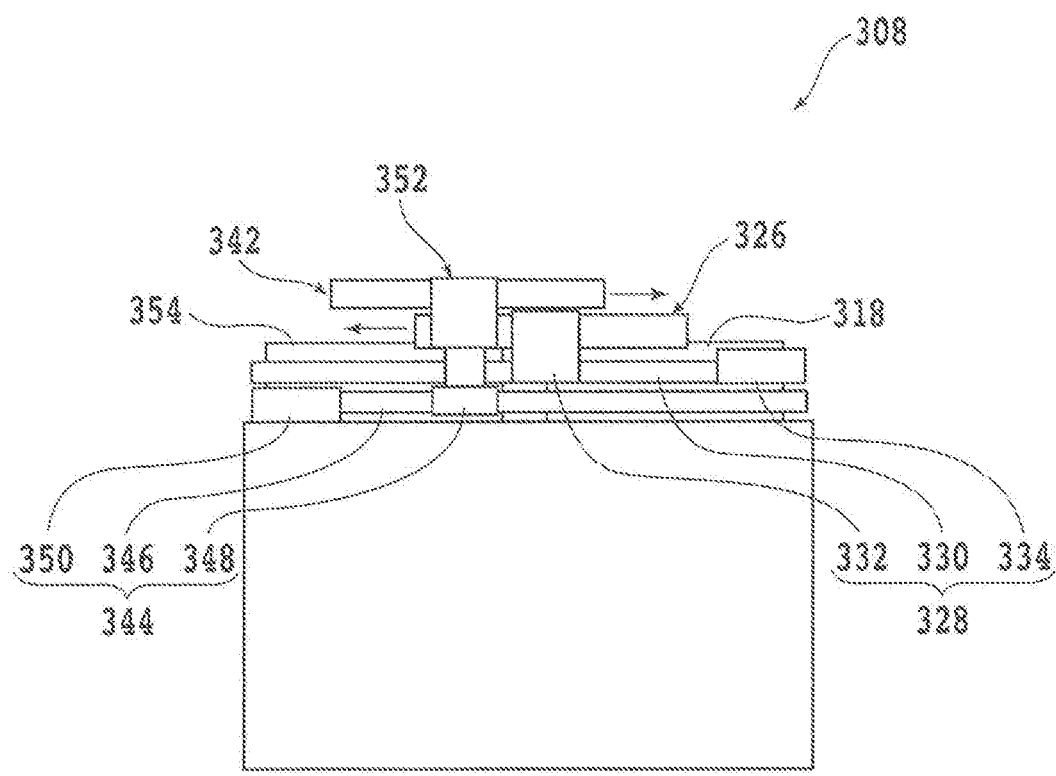
FIG. 15 is a side view schematically illustrating how a first temporary putting base and a second temporary putting base of the stock unit according to the third embodiment are moved in a second direction and the positions of the first temporary putting base and the second temporary putting base are interchanged.

FIG. 15 is a side view schematically illustrating how the first temporary putting base 326 and the second temporary putting base 342 are moved in the second direction and the position of the first temporary putting base 326 and the position of the second temporary putting base 342 are interchanged. When the position of the first temporary putting base 326 and the position of the second temporary putting base 342 are interchanged, first, the second temporary putting base 342 is raised by the raising-lowering mechanism 352. Specifically, the second temporary putting base 342 is positioned to a rising position at which the height of the lower end of the second temporary putting base 342 is higher than the height of the upper end of the first temporary putting base 326.

Thereafter, in the state in which the second temporary putting base 342 is positioned at the rising position, the second temporary putting base 342 is moved to the first position side by the second temporary putting base movement part 344. Furthermore, at the same timing, the first temporary putting base 326 is moved to the second position side by the first temporary putting base movement part 328. In FIG. 15, how the first temporary putting base 326 is moved from the first position to the second position and the second temporary putting base 342 is moved from the second position to the first position is illustrated.

After the movement of the first temporary putting base 326 and the second temporary putting base 342 is completed, the second temporary putting base 342 is lowered by the raising-lowering mechanism 352 and the second temporary putting base 342 is positioned to a reference position at which the height of the lower end of the second temporary putting base 342 is substantially equal to the height of the lower end of the first temporary putting base 326. As above, in the stock unit 308, the first temporary putting base 326 and the second temporary putting base 342 can be moved to be interchanged between the first position and the second position by the first temporary putting base movement part 328 and the second temporary putting base movement part 344.

A workpiece storage member holding base 354 that is raised and lowered by a ball-screw-type second raising-lowering mechanism (not illustrated) is disposed in a position facing the second position where the second workpiece movement unit 336 is disposed. The workpiece storage member 38 or the workpiece storage member 138 (hereinafter, referred to as the workpiece storage member 38 or the like) of the automated workpiece conveying vehicle 10 or the automated workpiece conveying vehicle 130 (hereinafter referred to as the automated workpiece conveying vehicle 10 or the like) is placed on an upper surface of the workpiece storage member holding base 354. As illustrated in FIG. 13, an opening 316b is defined in a ceiling 316a of the casing 316 and extends vertically therethrough in a region directly above the workpiece storage member holding base 354. The opening 316b is of such a shape and size that allow the workpiece storage member 38 or the like placed on the workpiece storage member holding base 354 to pass therethrough.

A control apparatus 362 for controlling operation of the stock unit 308 is connected to constituent elements such as the second raising-lowering mechanism that raises and lowers the cassette holding base 318, the first workpiece movement unit 320, the first temporary putting base movement part 328, the second workpiece movement unit 336, the second temporary putting base movement part 344, the raising-lowering mechanism 352, and the second raising-lowering mechanism that raises and lowers the workpiece storage member holding base 354. Typically, the control apparatus 362 is formed of a computer including a processing apparatus such as a CPU and a storing apparatus such as a flash memory, and functions of the control apparatus 362 are implemented by causing the processing apparatus and so forth to operate in accordance with software stored in the storing apparatus.

A receiver 364 that receives a signal for control (control signal) transmitted from the control unit 12 of the conveyance system and a transmitter 366 that transmits a signal for notification (notification signal) to the control unit 12 are further connected to the control apparatus 362. The control apparatus 362 controls the operation of the stock unit 308 based on the signal received by the receiver 364. Furthermore, the control apparatus 362 transmits the necessary signal to the control unit 12 through the transmitter 366.

Next, operation of the stock unit 308 according to the present embodiment will be described. FIG. 16A, FIG. 16B, FIG. 17A, and FIG. 17B are plan views schematically illustrating an example of operation of the stock unit 308. In the present embodiment, the description will be made about operation in the case in which the first temporary putting base 326 is positioned at the first position and the second temporary putting base 342 is positioned at the second position. However, operation in the case in which the first temporary putting base 326 is positioned at the second position and the second temporary putting base 342 is positioned at the first position is also the same.

For example, the automated workpiece conveying vehicle 10 or the like places the workpiece storage member 38 or the like in which the workpiece 11 (frame 15) after processing is housed on the workpiece storage member holding base 354. On the cassette holding base 318, the cassette 20 in which the workpiece 11 (frame 15) before processing is housed is placed in advance.

Figure 16A:
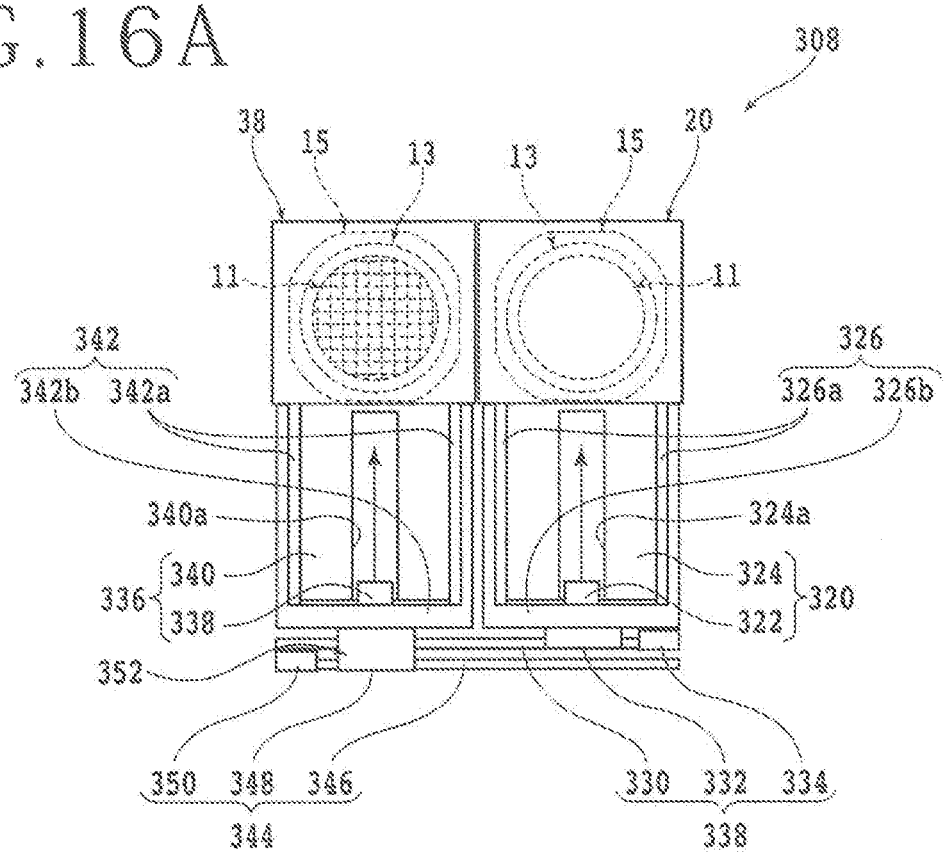
FIG. 16A and FIG. 16B are plan views schematically illustrating an example of operation of the stock unit according to the third embodiment.

Thereafter, as illustrated in FIG. 16A, the grasping part 322 is brought close to the cassette 20 on the cassette holding base 318 and the frame 15 housed in the cassette 20 is grasped by the grasping part 322. At the same timing, the grasping part 338 is brought close to the workpiece storage member 38 or the like on the workpiece storage member holding base 354 and the frame 15 housed in the workpiece storage member 38 or the like is grasped by the grasping part 338.

Figure 16B:
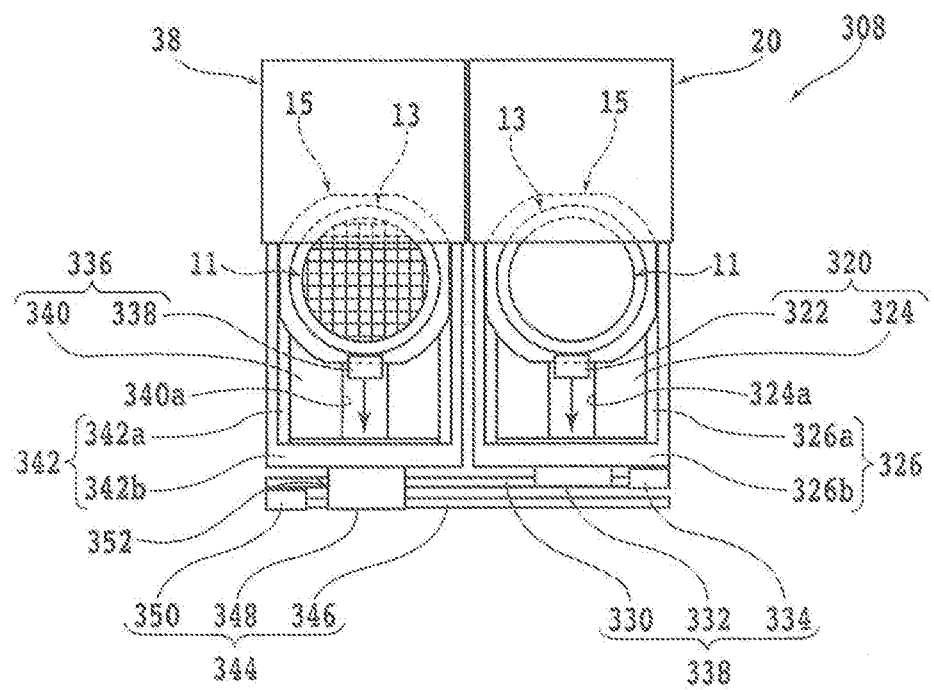

After the frame 15 inside the cassette 20 is grasped by the grasping part 322, the grasping part 322 is brought further away from the cassette holding base 318 as illustrated in FIG. 16B. Similarly, after the frame 15 inside the workpiece storage member 38 or the like is grasped by the grasping part 338, the grasping part 338 is brought further away from the workpiece storage member holding base 354 as illustrated in FIG. 16B. Thereby, the workpiece 11 before processing is drawn out from the cassette 20 to the first temporary putting base 326, and the workpiece 11 after processing is drawn out from the workpiece storage member 38 or the like to the second temporary putting base 342.

Figure 17A:
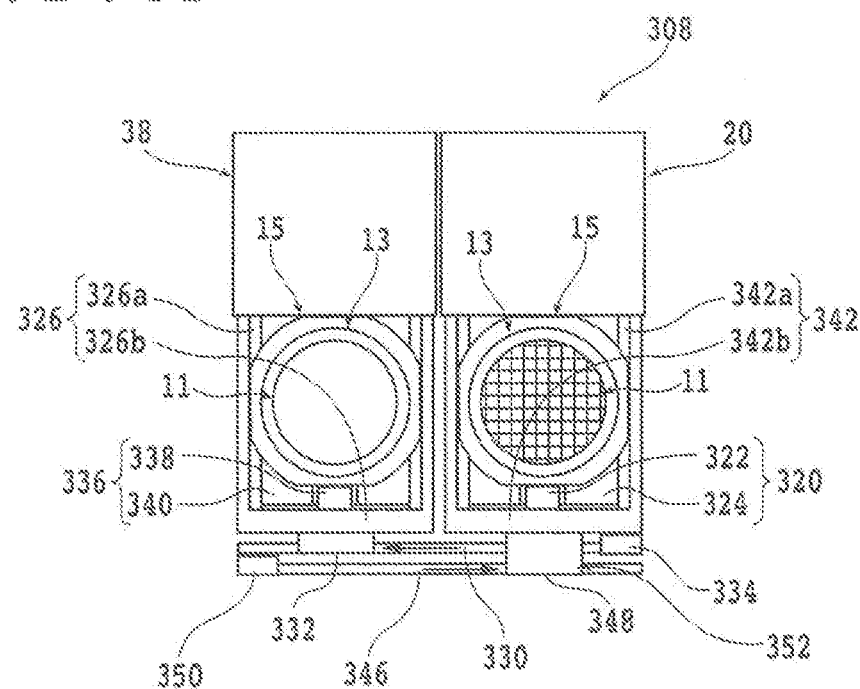
FIG. 17A and FIG. 17B are plan views schematically illustrating the example of the operation of the stock unit according to the third embodiment.

Next, as illustrated in FIG. 17A, the first temporary putting base 326 and the second temporary putting base 342 are moved to be interchanged between the first position and the second position. Specifically, the second temporary putting base 342 is raised by the raising-lowering mechanism 352 and is positioned to the rising position. Then, the second temporary putting base 342 is moved toward the first position side along the second direction.

Furthermore, at the same timing, the first temporary putting base 326 is moved toward the second position side along the second direction. After the movement of the first temporary putting base 326 and the second temporary putting base 342 is completed, the second temporary putting base 342 is lowered by the raising-lowering mechanism 352 and is positioned to the reference position. As a result, the first temporary putting base 326 is positioned to the second position facing the workpiece storage member holding base 354 and the second temporary putting base 342 is positioned to the first position facing the cassette holding base 318.

Figure 17B:
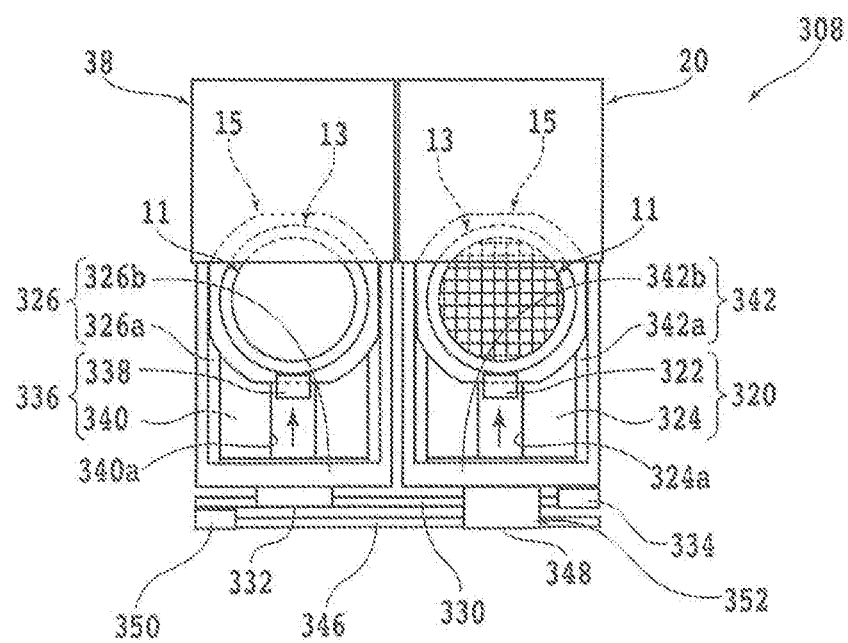

Thereafter, as illustrated in FIG. 17B, the frame 15 on the first temporary putting base 326 is grasped by the grasping part 338 and the grasping part 338 is brought close to the workpiece storage member 38 or the like on the workpiece storage member holding base 354. Thereby, the frame 15 that supports the workpiece 11 before processing and is on the first temporary putting base 326 is housed in the workpiece storage member 38 or the like on the workpiece storage member holding base 354.

At the same timing, the frame 15 on the second temporary putting base 342 is grasped by the grasping part 322, and the grasping part 322 is brought close to the cassette 20 on the cassette holding base 318. Thereby, the frame 15 that supports the workpiece 11 after processing and is on the second temporary putting base 342 is housed in the cassette 20 on the cassette holding base 318.

The automated workpiece conveying vehicle 10 or the like conveys the workpiece storage member 38 or the like from the workpiece storage member holding base 354 after the frame 15 on the first temporary putting base 326 has been stored in the workpiece storage member 38 or the like on the workpiece storage member holding base 354. Through the above, the workpiece 11 after processing can be conveyed from the automated workpiece conveying vehicle 10 or the like to the stock unit 308 and the workpiece 11 before processing can be conveyed from the stock unit 308 to the automated workpiece conveying vehicle 10 or the like.

The first temporary putting base 326 and the second temporary putting base 342 have the same functions and the frame 15 carried out from the cassette 20 can be temporarily put on either of the first temporary putting base 326 or the second temporary putting base 342. For example, when the second temporary putting base 342 is positioned at the first position, the frame 15 carried out from the cassette 20 is temporarily put on the second temporary putting base 342.

Furthermore, the above-described first workpiece movement unit 320 moves the workpiece 11 between the first temporary putting base 326 or the second temporary putting base 342 positioned at the first position and the cassette holding base 318 (cassette 20). Similarly, the second workpiece movement unit 336 moves the workpiece 11 between the second temporary putting base 342 or the first temporary putting base 326 positioned at the second position and the workpiece storage member holding base 354 (workpiece storage member 38 or the like).

The present invention is not limited to the description of the above embodiments, but various changes and modifications may be made therein. For example, the automated workpiece conveying vehicle 10, etc. may be allowed to travel in only one direction along the track 6, i.e., for one-way travel, or may be allowed to travel bidirectionally along the track 6. In case the automated workpiece conveying vehicle 10, etc. is allowed to travel in only one direction, a forward track 6 and a return track 6 may be disposed on the processing apparatus, i.e., processing apparatus, 4.

Besides, structures, methods, and so forth relating to the above-described embodiments, modification examples, and so forth can be implemented with appropriate changes without departing from the range of the object of the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A conveyance system for conveying a workpiece to each of a plurality of processing apparatuses, comprising:
   a track extending over the plurality of processing apparatuses and fixed to upper portions of the processing apparatuses;
   an automated conveying vehicle for traveling on the track, the automated conveying vehicle including a storage member having a housing space for housing the workpiece therein, a traveling member coupled from above to the storage member, a traveling mechanism mounted on the traveling member, a lifting and lowering mechanism mounted on the traveling member, for lifting and lowering the storage member while suspending the storage member from above, and a receiver for receiving control signals;
   a stock unit having a storage member holding base for holding the storage member thereon when the workpiece is transferred from a workpiece stocker that houses the workpiece therein to the storage member of the automated conveying vehicle, and a receiver for receiving control signals; and
   a control unit including a transmitter for transmitting control signals to a processing apparatus, the automated conveying vehicle, and the stock unit, a receiver for receiving notification signals from the processing apparatus, and a control signal generating section for generating control signals to be transmitted from the transmitter,
   wherein the control signal generating section of the control unit generates control signals to be transmitted from the transmitter of the control unit on a basis of the notification signals received by the receiver of the control unit,
   the transmitter of the control unit transmits control signals generated by the control signal generating section of the control unit to the processing apparatus, the automated conveying vehicle, and the stock unit, and
   the automated conveying vehicle travels on the track on a basis of control signals received by the receiver thereof.

2. The conveyance system according to claim 1,
   wherein the track includes a plurality of rails connected together, and
   the automated conveying vehicle travels on the rails with the storage member disposed below the rails.

3. The conveyance system according to claim 1,
   wherein the track includes legs having suction members that adhere under suction to the processing apparatus, and is fixed to the processing apparatus by the suction members.

4. The conveyance system according to claim 2,
   wherein the track includes legs having suction members that adhere under suction to the processing apparatus, and is fixed to the processing apparatus by the suction members.

* * * * *